(12) United States Patent
Son et al.

(10) Patent No.: US 11,355,497 B2
(45) Date of Patent: Jun. 7, 2022

(54) MEMORY CELL CAPACITOR WITH VARYING WIDTH AND SUPPORTIVE STRUCTURES

(71) Applicant: Samsung Electronics Co., Ltd., Suwon-si (KR)

(72) Inventors: Yoonho Son, Hwaseong-si (KR); Suklae Kim, Seoul (KR); Sejin Park, Hwaseong-si (KR); Seungjoong Shin, Hwaseong-si (KR); Hyuewon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/077,257

(22) Filed: Oct. 22, 2020

(65) Prior Publication Data

US 2021/0257371 A1 Aug. 19, 2021

(30) Foreign Application Priority Data

Feb. 14, 2020 (KR) .......................... 10-2020-0018452

(51) Int. Cl.
*H01L 27/108* (2006.01)
*H01L 49/02* (2006.01)

(52) U.S. Cl.
CPC .. *H01L 27/10814* (2013.01); *H01L 27/10823* (2013.01); *H01L 27/10852* (2013.01); *H01L 28/60* (2013.01)

(58) Field of Classification Search
CPC ......... H01L 27/10814; H01L 27/10823; H01L 27/10852; H01L 28/60; H01L 21/0228; H01L 21/02164; H01L 21/02274; H01L 28/84; H01L 21/02159; H01L 21/3142;
(Continued)

(56) References Cited

U.S. PATENT DOCUMENTS 6,207,487 B1\* 3/2001 Kim ................. H01L 21/31691
438/238
6,822,280 B2 11/2004 Ito et al.
7,666,797 B2 2/2010 Shea et al.
(Continued)

FOREIGN PATENT DOCUMENTS

KR 10-2005-0062679 A 6/2005
KR 10-2009-0032880 A 4/2009
(Continued)

*Primary Examiner* — Nicholas J Tobergte
*Assistant Examiner* — Tenley H Schofield
(74) *Attorney, Agent, or Firm* — Muir Patent Law, PLLC

(57) ABSTRACT

A semiconductor device includes a memory cell storing data. The memory cell capacitor includes a plurality of bottom electrodes on a substrate and extending in a vertical direction with respect to a top surface of the substrate, the plurality of bottom electrodes being spaced apart from each other in a first direction parallel to the top surface of the substrate, an upper support pattern on upper lateral surfaces of the plurality of bottom electrodes, and a lower support pattern on lower lateral surfaces of the plurality of bottom electrodes. The lower support pattern is disposed between the substrate and the upper support pattern, and a first bottom electrode of the plurality of bottom electrodes includes a first recess adjacent to a bottom surface of the lower support pattern.

18 Claims, 24 Drawing Sheets

(58) Field of Classification Search
CPC ............. H01L 21/022; H01L 21/02148; H01L 21/0217; H01L 21/31111; H01L 21/31625
See application file for complete search history.

(56) References Cited

U.S. PATENT DOCUMENTS

| | | | |
|---|---|---|---|
| 7,700,469 B2 * | 4/2010 | Benson | .................... H01L 28/91 438/386 |
| 7,919,863 B2 | 4/2011 | Benson | |
| 8,790,986 B2 | 7/2014 | Choi et al. | |
| 9,287,349 B2 | 3/2016 | Kim et al. | |
| 10,319,805 B2 | 6/2019 | Yoon et al. | |
| 2006/0263971 A1 | 11/2006 | Lee et al. | |
| 2013/0149833 A1 * | 6/2013 | Choi | ........................ H01L 28/92 438/381 |
| 2013/0230961 A1 * | 9/2013 | Kim | ........................ H01L 28/60 438/381 |
| 2013/0277724 A1 * | 10/2013 | Jun | .................... H01L 27/10852 257/296 |
| 2014/0134839 A1 * | 5/2014 | Kim | ......................... H01L 28/92 438/652 |
| 2015/0214289 A1 * | 7/2015 | Kim | .................. H01L 27/10852 438/387 |
| 2017/0103987 A1 * | 4/2017 | Kim | .................. H01L 27/10826 |
| 2017/0345886 A1 * | 11/2017 | Yi | ........................... H01L 28/87 |
| 2018/0122810 A1 * | 5/2018 | Han | ........................ H01L 28/87 |
| 2018/0151666 A1 * | 5/2018 | Yew | ........................ H01L 28/91 |

FOREIGN PATENT DOCUMENTS

| | | |
|---|---|---|
| KR | 10-2009-0044865 A | 5/2009 |
| KR | 10-1090369 B1 | 12/2011 |
| KR | 10-2012-0004212 A | 1/2012 |
| KR | 1020180042591 A | 4/2018 |
| KR | 10-1873331 B1 | 7/2018 |

* cited by examiner

MEMORY CELL CAPACITOR WITH VARYING WIDTH AND SUPPORTIVE STRUCTURES

CROSS-REFERENCE TO RELATED APPLICATION

This U.S. nonprovisional application claims priority under 35 U.S.C § 119 to Korean Patent Application No. 10-2020-0018452 filed on Feb. 14, 2020 in the Korean Intellectual Property Office, the disclosure of which is incorporated by reference herein in its entirety.

BACKGROUND

The present inventive concepts relate to a semiconductor device, and more particularly, to a semiconductor device including a capacitor.

As semiconductor devices are developed to high integration, capacitors are desirable to have high capacitance in a limited area. The capacitance of the capacitor is proportional to a surface of an electrode and a dielectric constant of a dielectric layer while being inversely proportional to an equivalent oxide thickness of the dielectric layer. The higher an aspect ratio of a capacitor bottom electrode, the larger the capacitance of the capacitor. Thus, research has been variously conducted on process technology for forming the capacitor whose an aspect ratio is high.

SUMMARY

Some example embodiments of the present inventive concepts provide a semiconductor device with improved electrical characteristics and a method of fabricating the same.

Some example embodiments of the present inventive concepts provide a semiconductor device with high integration and a method of fabricating the same.

According to an exemplary embodiment of the present invention, a semiconductor device includes a memory cell storing data. The memory cell capacitor includes a plurality of bottom electrodes on a substrate and extending in a vertical direction with respect to a top surface of the substrate, the plurality of bottom electrodes being spaced apart from each other in a first direction parallel to the top surface of the substrate, an upper support pattern on upper lateral surfaces of the plurality of bottom electrodes, and a lower support pattern on lower lateral surfaces of the plurality of bottom electrodes. The lower support pattern is disposed between the substrate and the upper support pattern, and a first bottom electrode of the plurality of bottom electrodes includes a first recess adjacent to a bottom surface of the lower support pattern.

According to an exemplary embodiment of the present invention, a semiconductor device includes a plurality of bottom electrodes on a substrate and extending in a vertical direction with respect to a top surface of the substrate, the plurality of bottom electrodes being spaced apart from each other in a first direction parallel to the top surface of the substrate, a lower support pattern on lower lateral surfaces of the plurality of bottom electrodes, an upper support pattern on the lower support pattern and on upper lateral surfaces of the plurality of bottom electrodes, a top electrode that fills a space between the plurality of bottom electrodes, a space between the substrate and the lower support pattern, and a space between the lower support pattern and the upper support pattern, and a dielectric layer between the top electrode and each of the upper support pattern and the lower support pattern, and between the top electrode and each of the plurality of bottom electrodes. A first bottom electrode of the plurality of bottom electrodes includes a first recess adjacent to a bottom surface of the lower support pattern and a second recess adjacent to a top surface of the lower support pattern.

According to an exemplary embodiment of the present invention, a method of fabricating a semiconductor device includes sequentially forming a first mold layer, a lower support layer, a second mold layer, and an upper support layer on a substrate, forming on the substrate a plurality of bottom electrodes that penetrate the first mold layer, the lower support layer, the second mold layer, and the upper support layer, patterning the upper support layer to form an upper support pattern that has at least one upper opening, removing the second mold layer via the at least one upper opening to partially expose upper lateral surfaces of the plurality of bottom electrodes, patterning the lower support layer to form a lower support pattern that has at least one lower opening, removing at least a portion of the first mold layer via the at least one lower opening to partially expose lower lateral surfaces of the plurality of bottom electrodes, and after removing at least the portion of the first mold layer, etching the exposed lower lateral surfaces of the plurality of bottom electrodes and the exposed upper lateral surfaces of the plurality of bottom electrodes.

DETAILED DESCRIPTION OF EMBODIMENTS

The following will now describe in detail some example embodiments of the present inventive concepts with reference to the accompanying drawings.

Figure 1:
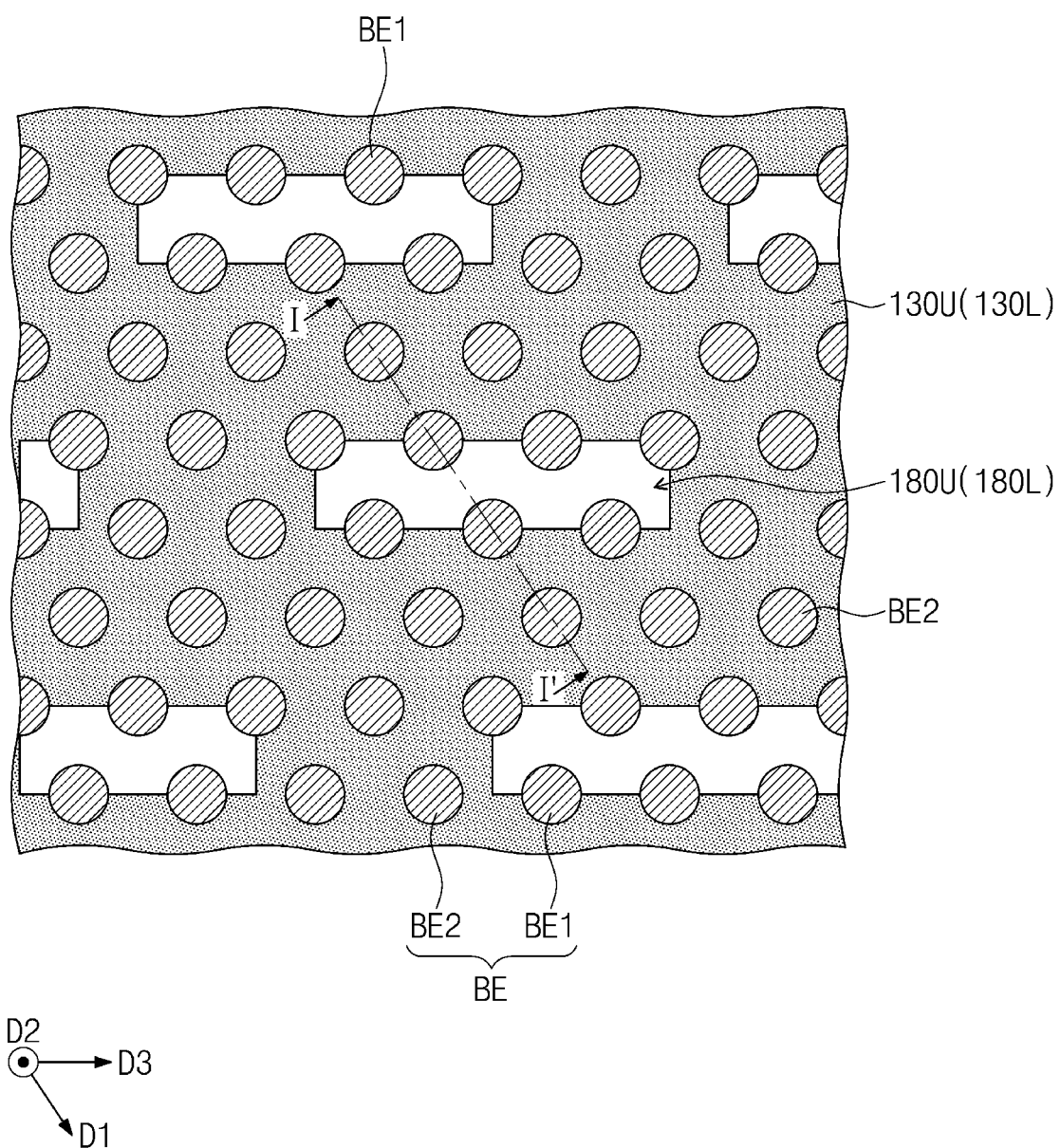
FIG. 1 illustrates a plan view showing a semiconductor device according to some example embodiments of the present inventive concepts.
Figure 2:
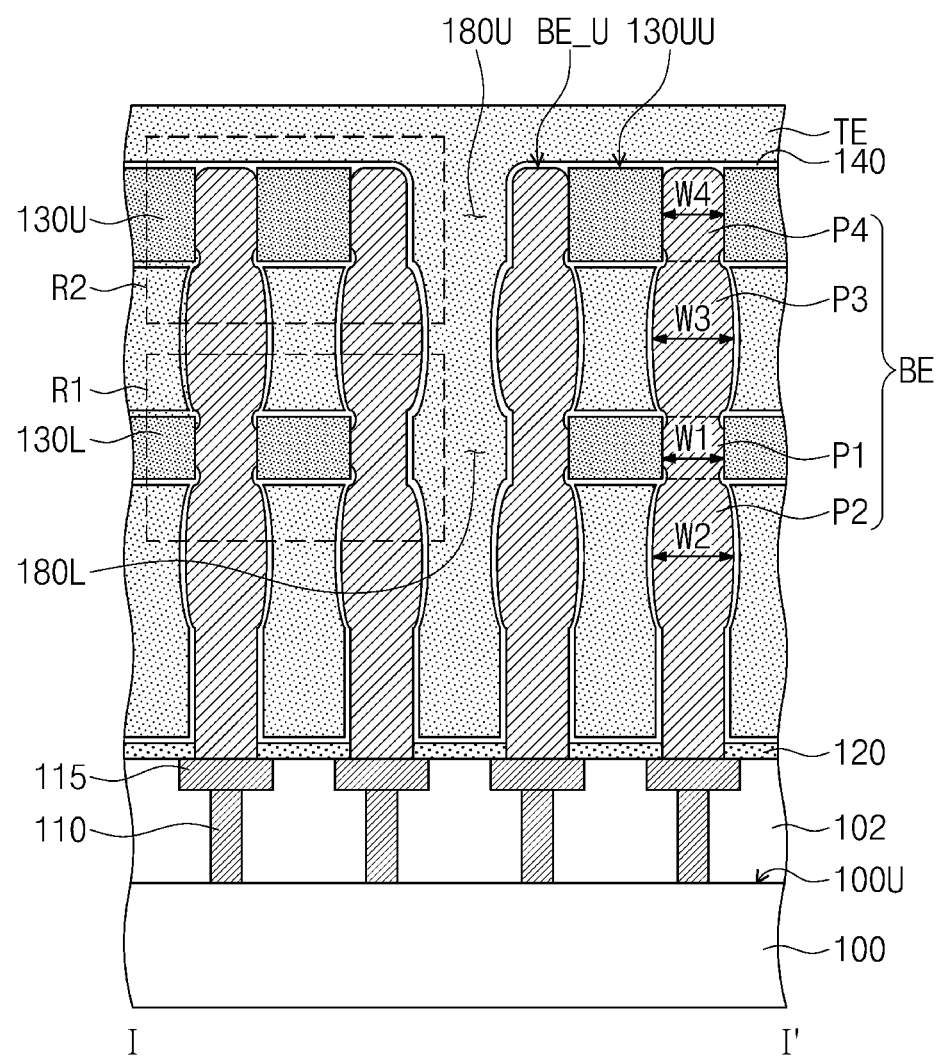
FIG. 2 illustrates a cross-sectional view taken along line I-I' of FIG. 1.
Figure 2:
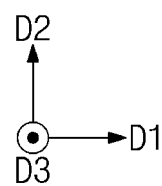
Figure 3A:
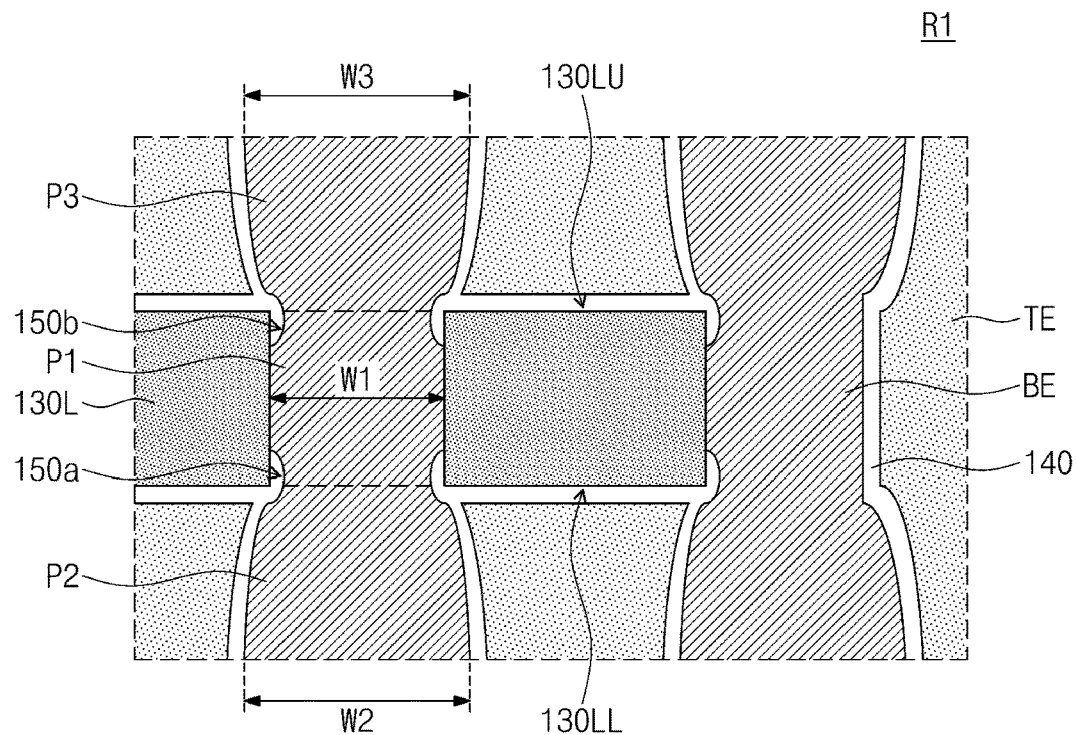
FIGS. 3A and 3B illustrate enlarged views respectively showing sections R1 and R2 of FIG. 2.
Figure 3B:
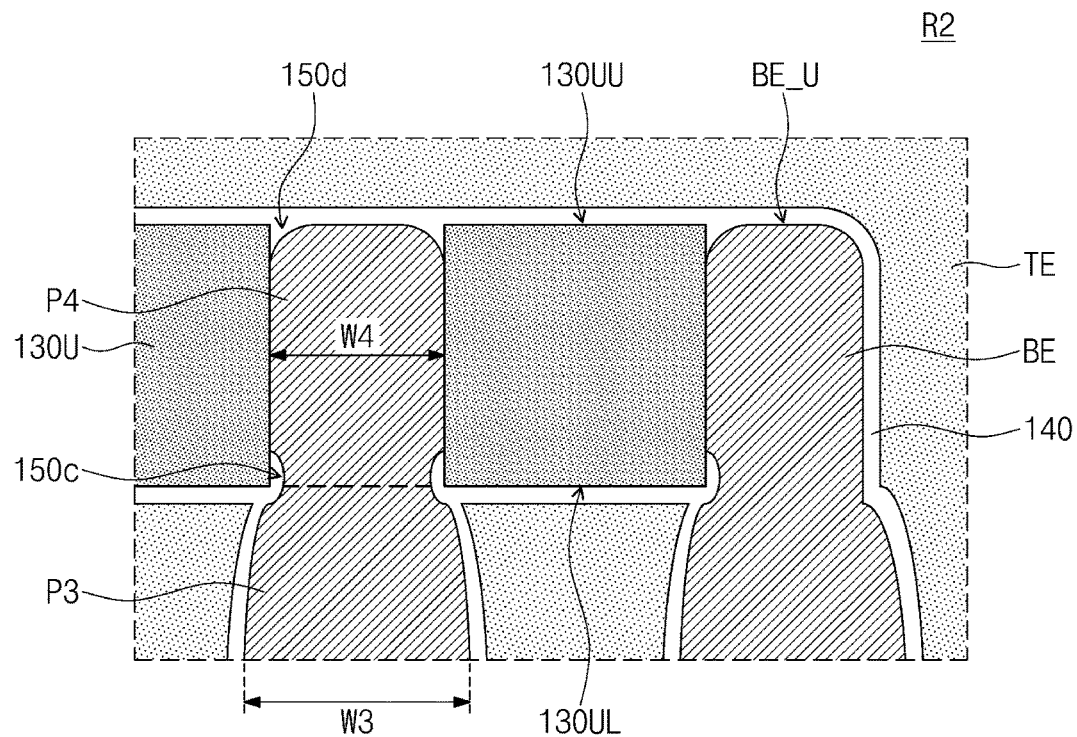

FIG. 1 illustrates a plan view showing a semiconductor device according to some example embodiments of the present inventive concepts. FIG. 2 illustrates a cross-sectional view taken along line I-I' of FIG. 1. FIGS. 3A and 3B illustrate enlarged views respectively showing sections R1 and R2 of FIG. 2.

Referring to FIGS. 1 and 2, an interlayer dielectric layer 102 may be disposed on a substrate 100. The substrate 100 may include a semiconductor substrate, such as a silicon (Si) substrate, a germanium (Ge) substrate, or a silicon-germanium (Si—Ge) substrate. The interlayer dielectric layer 102 may include, for example, at least one selected from silicon oxide, silicon nitride, and silicon oxynitride.

Conductive contacts 110 and contact pads 115 may be disposed in the interlayer dielectric layer 102. Each of the conductive contacts 110 may penetrate a lower portion of the interlayer dielectric layer 102 and may have an electrical connection with the substrate 100. The contact pads 115 may be disposed on corresponding conductive contacts 110. The contact pads 115 may penetrate an upper portion of the interlayer dielectric layer 102 and may have electrical connections with corresponding conductive contacts 110. The conductive contacts 110 and the contact pads 115 may include at least one selected from semiconductor materials (e.g., polycrystalline silicon), metal-semiconductor compounds (e.g., tungsten silicide), conductive metal nitrides (e.g., titanium nitride, tantalum nitride, and/or tungsten nitride), and metals (e.g., titanium, tungsten, and/or tantalum).

An insulating layer 120 may be disposed on the interlayer dielectric layer 102. The insulating layer 120 may cover at least a portion of a top surface of the interlayer dielectric layer 102 and at least portions of top surfaces of the contact pads 115. For example, the insulating layer 120 may contact the at least a portion of the top surface of the interlayer dielectric layer 102 and the at least portions of the top surfaces of the contact pads 115. The insulating layer 120 may include, for example, at least one selected from oxide, nitride, and oxynitride.

A plurality of bottom electrodes BE may be disposed horizontally spaced apart from each other on the interlayer dielectric layer 102. For example, the plurality of bottom electrodes BE may be spaced apart from each other along a first direction D1 parallel to a top surface 100U of the substrate 100. The plurality of bottom electrodes BE may penetrate the insulating layer 120 and may have connections with corresponding contact pads 115. According to some example embodiments, each of the plurality of bottom electrodes BE may have a pillar shape.

A lower support pattern 130L may be disposed on lower lateral surfaces (i.e., first portion of lateral surfaces) of the plurality of bottom electrodes BE. The lower support pattern 130L may contact the lower lateral surfaces of the plurality of bottom electrodes BE. The lower support pattern 130L may be vertically spaced apart from the interlayer dielectric layer 102 and the insulating layer 120 along a second direction D2 perpendicular to the top surface 100U of the substrate 100. The lower support pattern 130L may have at least one lower opening 180L. In an example embodiment, the plurality of bottom electrodes BE may include a plurality of first bottom electrodes BE1 that are exposed by the plurality of lower openings 180L, and a plurality of second bottom electrodes BE2 that are surrounded by the lower support pattern 130L. For example, the lower lateral surfaces of the plurality of first bottom electrodes BE1 may be partially exposed by the lower openings 180L and partially covered by the lower support pattern 130L, and the lower lateral surfaces of the plurality of second bottom electrodes BE2 may be surrounded by the lower support pattern 130L. When viewed in plan, the at least one lower opening 180L may extend along a third direction D3 that is parallel to the to the top surface 100U of the substrate 100 and intersects the first direction D1, and may also extend along the lower lateral surfaces of the plurality of first bottom electrodes BE1. In an embodiment, the first direction D1 and the third direction D3 may form at an acute angle therebetween. According to some example embodiments, the lower support pattern 130L may have a plurality of lower openings 180L that are horizontally spaced apart from each other. Each of the plurality of lower openings 180L may extend along the lower lateral surfaces of corresponding ones of the plurality of first bottom electrodes BE1.

An upper support pattern 130U may be disposed on upper lateral surfaces (i.e., second portion of the lateral surfaces) of the plurality of bottom electrodes BE. The upper support pattern 130U may contact the upper lateral surfaces of the plurality of bottom electrodes BE. The upper support pattern 130U may be vertically spaced apart along the second direction D2 from the lower support pattern 130L. The upper support pattern 130U may have at least one upper opening 180U. In an example embodiment, the plurality of first bottom electrodes BE1 may be exposed by the plurality of upper openings 180U and the plurality of second bottom electrodes BE2 may be surrounded by the upper support pattern 130U. For example, the upper lateral surfaces of the plurality of first bottom electrodes BE1 may be partially exposed by the upper openings 180U and partially covered by the upper support pattern 130U, and the upper lateral surfaces of the plurality of second bottom electrodes BE2 may be surrounded by the upper support pattern 130U. When viewed in plan, the at least one upper opening 180U may extend along the third direction D3, and may also extend along the upper lateral surfaces of the plurality of first bottom electrodes BE1. The at least one upper opening 180U may vertically overlap along the second direction D2 with the at least one lower opening 180L. According to some example embodiments, the upper support pattern 130U may have a plurality of upper openings 180U that are horizontally spaced apart from each other. Each of the plurality of upper openings 180U may extend along the upper lateral surfaces of corresponding ones of the plurality of first bottom electrodes BE1. The plurality of upper openings 180U may vertically overlap along the second direction D2 with the plurality of lower openings 180L, respectively.

The plurality of bottom electrodes BE may penetrate the upper support pattern 130U, the lower support pattern 130L, and the insulating layer 120, and may have connections with corresponding contact pads 115. Each of the plurality of bottom electrodes BE may have an uppermost surface BE_U at substantially the same height as that of a top surface 130UU of the upper support pattern 130U, but the present inventive concepts are not necessarily limited thereto. Differently from that shown, the uppermost surface BE_U of each of the plurality of bottom electrodes BE may be located at a height lower than that of the top surface 130UU of the upper support pattern 130U. In this disclosure, the term "height" may be a distance measured from the top surface 100U of the substrate 100. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

A top electrode TE may be disposed on the interlayer dielectric layer 102, and may cover the plurality of bottom electrodes BE, the lower support pattern 130L, and the upper support pattern 130U. The top electrode TE may fill a space between the plurality of bottom electrodes BE, a space between the interlayer dielectric layer 102 and the lower support pattern 130L, and a space between the lower support pattern 130L and the upper support pattern 130U. The insulating layer 120 may be interposed between the top electrode TE and the interlayer dielectric layer 102. The top electrode TE may penetrate the upper support pattern 130U and the lower support pattern 130L by passing through the at least one upper opening 180U and the at least one lower opening 180L. The top electrode TE may penetrate the upper support pattern 130U and the lower support pattern 130L by filling the at least one upper opening 180U and the at least one lower opening 180L. For example, the top electrode TE may completely fill the at least one upper opening 180U and the at least one lower opening 180L.

A dielectric layer 140 may be interposed between the top electrode TE and each of the plurality of bottom electrodes BE, between the top electrode TE and the lower support pattern 130L, and between the top electrode TE and the upper support pattern 130U. The dielectric layer 140 may extend between the top electrode TE and the insulating layer 120. The dielectric layer 140 may separate the plurality of bottom electrodes BE from the top electrode TE.

The plurality of bottom electrodes BE and the top electrode TE may include at least one selected from polysilicon, metal, metal silicide, and metal nitride. The dielectric layer 140 may include at least one selected from oxide (e.g., a silicon oxide layer), nitride (e.g., a silicon nitride layer), oxynitride (e.g., a silicon oxynitride layer), and high-k dielectrics (e.g., a hafnium oxide layer). Each of the lower and upper support patterns 130L and 130U may include a dielectric material. For example, each of the lower and upper support patterns 130L and 130U may include at least one selected from oxide (e.g., silicon oxide), nitride (e.g., silicon nitride), and oxynitride (e.g., silicon oxynitride). In an exemplary embodiment, the lower and upper support patterns 130L and 130U may be formed of the same material or different materials from each other. Hereinafter, the reference characters "BE" may be commonly used to describe lateral surfaces of the plurality of first bottom electrodes BE1 and lateral surfaces of the plurality of second bottom electrodes BE2.

Referring to FIGS. 2 and 3A, at least one of the plurality of bottom electrodes BE may include a first recess 150a adjacent to a bottom surface 130LL of the lower support pattern 130L. The first recess 150a may be a region that is recessed into the at least one bottom electrode BE from a lateral surface of the at least one bottom electrode BE. The dielectric layer 140 may cover the bottom surface 130LL of the lower support pattern 130L and may fill at least a portion of the first recess 150a. The at least one bottom electrode BE may further include a second recess 150b adjacent to a top surface 130LU of the lower support pattern 130L. The second recess 150b may be a region that is recessed into the at least one bottom electrode BE from the lateral surface of the at least one bottom electrode BE. The dielectric layer 140 may cover the top surface 130LU of the lower support pattern 130L and may fill at least a portion of the second recess 150b.

The at least one bottom electrode BE may include a first part P1 in the lower support pattern 130L and a second part P2 below the lower support pattern 130L. The second part P2 of the at least one bottom electrode BE may have a maximum width W2 greater than a maximum width W1 of the first part P1 of the at least one bottom electrode BE. In this disclosure, the term "width" may be a distance measured along a direction (e.g., the first direction D1) parallel to the top surface 100U of the substrate 100. The at least one bottom electrode BE may include a third part P3 between the upper support pattern 130U and the lower support pattern 130L. The third part P3 of the at least one bottom electrode BE may have a maximum width W3 greater than the maximum width W1 of the first part P1 of the at least one bottom electrode BE. The first recess 150a may be positioned at the boundary between the first part P1 of the at least one bottom electrode BE and the second part P2 thereof. The second recess 150b may be positioned at the boundary between the first part P1 of the at least one bottom electrode BE and the third part P3 thereof. In an exemplary embodiment, the first part P1 of the at least one bottom electrode BE may include a first portion that contacts the lower support pattern 130L. The first portion of the first part P1 may be disposed between the first recess 150a and the second recess 150b. The first part P1 of the at least one bottom electrode BE may further include a second portion spaced apart from the lower support pattern 130L with a portion of the dielectric layer 140 filling the first recess 150a therebetween. The first part P1 of the at least one bottom electrode BE may further include a third portion spaced apart from the lower support pattern 130L with a portion of the dielectric layer 140 filling the second recess 150b therebetween.

Referring to FIGS. 2 and 3B, the at least one bottom electrode BE may further include a third recess 150c adjacent to a bottom surface 130UL of the upper support pattern 130U. The third recess 150c may be a region that is recessed into the at least one bottom electrode BE from the lateral surface of the at least one bottom electrode BE. The dielectric layer 140 may cover the bottom surface 130UL of the upper support pattern 130U and may fill at least a portion of the third recess 150c. The at least one bottom electrode BE may further include a fourth recess 150d adjacent to the top surface 130UU of the upper support pattern 130U. The fourth recess 150d may be a region that is recessed into the at least one bottom electrode BE from the top surface BE_U of the at least one bottom electrode BE. The fourth recess 150d may expose a boundary between the at least one bottom electrode BE and the upper support pattern 130U. The dielectric layer 140 may cover the top surface 130UU of the upper support pattern 130U and may fill at least a portion of the fourth recess 150d.

The at least one bottom electrode BE may include a fourth part P4 in the upper support pattern 130U. The maximum width W3 of the third part P3 of the at least one bottom electrode BE may be greater than a maximum width W4 of the fourth part P4 of the at least one bottom electrode BE. The third recess 150c may be positioned at the boundary between the third part P3 of the at least one bottom electrode BE and the fourth part P4 thereof. The fourth recess 150d may be disposed along the rounded corner of the top surface BE_U of the at least one bottom electrode BE. In an exemplary embodiment, the fourth part P4 of the at least one bottom electrode BE may include a first portion that contacts the upper support pattern 130U. The first portion of the fourth part P4 may be disposed between the third recess 150c and the fourth recess 150d. The fourth part P4 of the at least one bottom electrode BE may further include a second portion spaced apart from the upper support pattern 130U with a portion of the dielectric layer 140 filling the third recess 150c therebetween. The fourth part P4 of the at least one bottom electrode BE may further include a third portion spaced apart from the lower support pattern 130L with a portion of the dielectric layer 140 filling the fourth recess 150d therebetween.

Referring back to FIGS. 1 and 2, a capacitor may be constituted by the plurality of bottom electrodes BE, the lower support pattern 130L, the upper support pattern 130U, the top electrode TE, and the dielectric layer 140.

The plurality of bottom electrodes BE may each have an aspect ratio that is relatively large to increase capacitance of the capacitor, and the lower support pattern 130L and the upper support pattern 130U may be used for securing structural stability of the plurality of bottom electrodes BE. In this case, during a process in which the plurality of bottom electrodes BE are formed, the plurality of bottom electrodes BE may be formed to have their relatively large widths between the upper and lower support patterns 130U and 130L and below the lower support pattern 130L, which may result in the occurrence of leakage current between neighboring bottom electrodes BE.

According to the present inventive concepts, between the upper and lower support patterns 130U and 130L and below the lower support pattern 130L, an etching process may be performed to partially etch the lateral surfaces of the plurality of bottom electrodes BE. The etching process may reduce widths of the plurality of bottom electrodes BE, and as a result, leakage current may be minimized between the plurality of bottom electrodes BE. In addition, during the etching process, the at least one bottom electrode BE may be formed to include the first, second, third, and fourth recesses 150a, 150b, 150c, and 150d.

FIGS. 4 to 9 and 11 illustrate cross-sectional views taken along line I-I' of FIG. 1, showing a method of fabricating a semiconductor device according to some example embodiments of the present inventive concepts. FIGS. 10A and 10B illustrate enlarged views respectively showing sections R3 and R4 of FIG. 9. For brevity of explanation, omission will be made to avoid duplicate description of the semiconductor device discussed above with reference to FIGS. 1, 2, 3A, and 3B.

Figure 4:
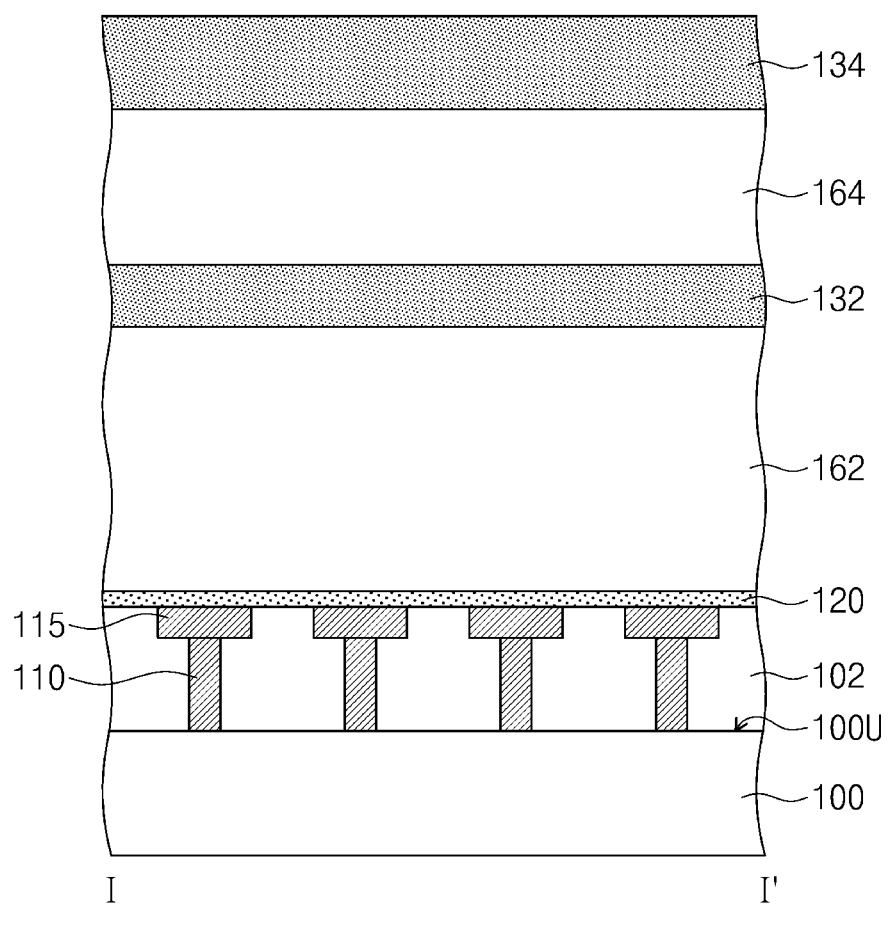
FIGS. 4 to 9 and 11 illustrate cross-sectional views taken along line I-I' of FIG. 1, showing a method of fabricating a semiconductor device according to some example embodiments of the present inventive concepts.
Figure 4:
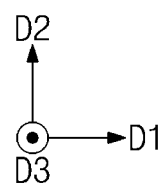

Referring to FIG. 4, an interlayer dielectric layer 102 may be formed on a substrate 100, and conductive contacts 110 and contact pads 115 may be formed in the interlayer dielectric layer 102. The formation of the conductive contacts 110 and the contact pads 115 may include forming contact holes (not shown) to penetrate a lower portion of the interlayer dielectric layer 102, forming pad holes (not shown) to penetrate an upper portion of the interlayer dielectric layer 102, and forming conductive layers to fill the contact holes and the pad holes.

An insulating layer 120 may be formed on the interlayer dielectric layer 102, and then a first mold layer 162, a lower support layer 132, a second mold layer 164, and an upper support layer 134 may be sequentially formed on the insulating layer 120. The first mold layer 162 and the second mold layer 164 may be formed of, for example, a silicon oxide layer. The insulating layer 120, the lower support layer 132, and the upper support layer 134 may be formed of a material having etch selectivity with respect to the first and second mold layers 162 and 164. For example, the insulating layer 120, the lower support layer 132, and the upper support layer 134 may include at least one selected from SiN, SiCN, TaO, and TiO$_2$. The upper support layer 134 may be formed to have a thickness substantially the same as or greater than that of the lower support layer 132. In this disclosure, the term "thickness" may be a distance measured in a direction (e.g., the second direction D2) perpendicular to a top surface 100U of the substrate 100. A deposition process, such as chemical vapor deposition (CVD) or physical vapor deposition (PVD), may be performed to form each of the insulating layer 120, the first mold layer 162, the lower support layer 132, the second mold layer 164, and the upper support layer 134.

Figure 5:
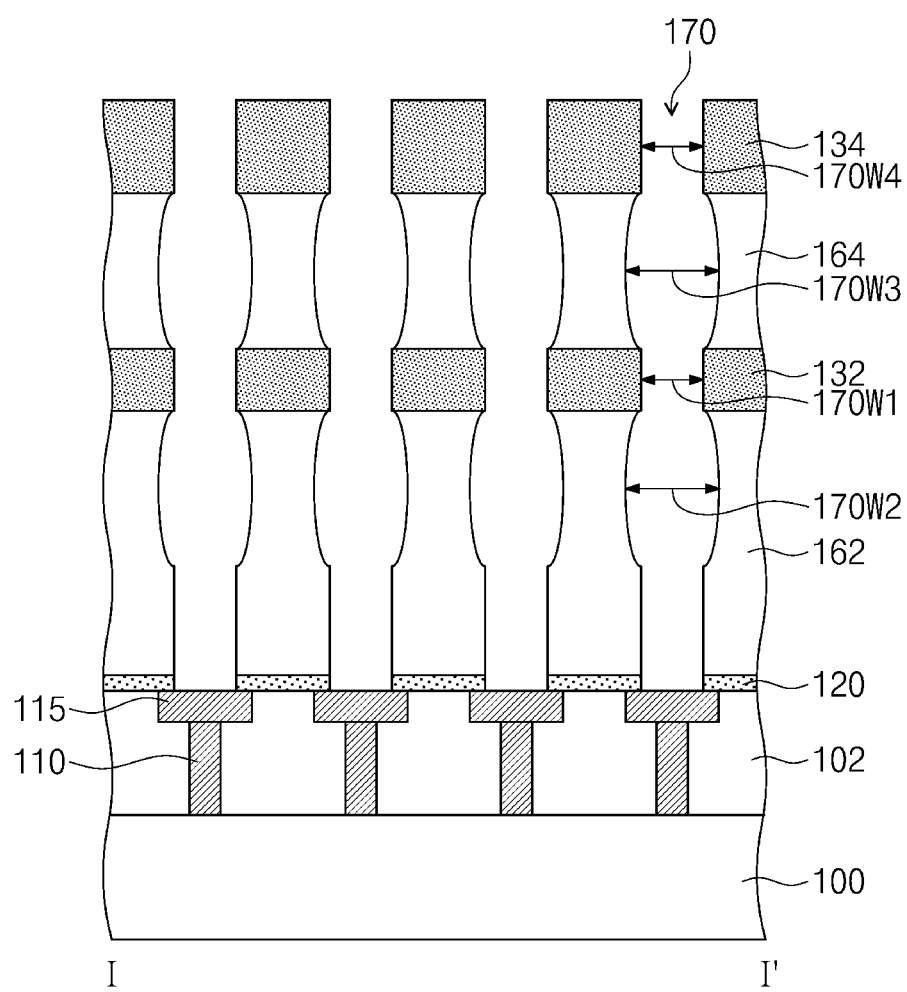

Referring to FIG. 5, vertical holes 170 may be formed in the stacked layers 120, 162, 132, 164, and 134. Each of the vertical holes 170 may penetrate the upper support layer 134, the second mold layer 164, the lower support layer 132, the first mold layer 162, and the insulating layer 120, and may expose a corresponding one of the contact pads 115. The vertical holes 170 may be horizontally spaced apart from each other on the interlayer dielectric layer 102. The formation of the vertical holes 170 may include, for example, forming on the upper support layer 134 a mask pattern (not shown) having a plurality of openings to define regions where the vertical holes 170 will be formed, and sequentially etching the upper support layer 134, the second mold layer 164, the lower support layer 132, the first mold layer 162, and the insulating layer 120 using the mask pattern as an etching mask.

For example, a dry etching process may be employed to etch the upper support layer 134, the second mold layer 164, the lower support layer 132, the first mold layer 162, and the insulating layer 120. In the dry etching process, a bowing phenomenon caused by ion scattering may occur such that the vertical holes 170 may be defined by concave lateral surfaces of the first and second mold layers 162 and 164. In some example embodiments, during the dry etching process, the first and second mold layers 162 and 164 may be etched more than the upper and lower support layers 134 and 132, and thus each of the vertical holes 170 may be formed to have a relatively large width in the first and second mold layers 162 and 164. For example, each of the vertical holes 170 formed in the lower support layer 132 may have a first maximum width 170W1, and each of the vertical holes 170 formed in the first mold layer 162 may have a second maximum width 170W2 greater than the first maximum width 170W1. Each of the vertical holes 170 formed in the second mold layer 164 may have a third maximum width 170W3 greater than the first maximum width 170W1, and each of the vertical holes 170 formed in the upper support layer 134 may have a fourth maximum width 170W4 less than the third maximum width 170W3.

Figure 6:
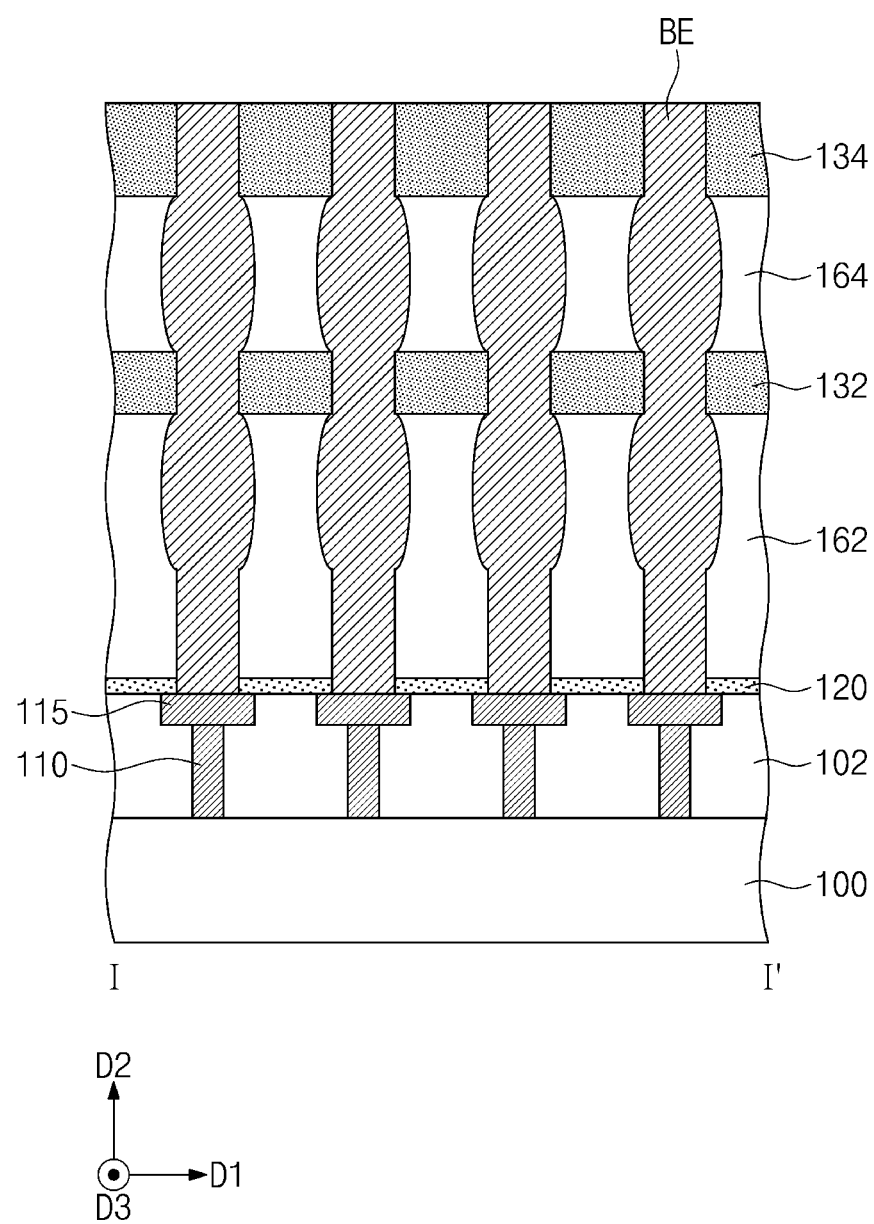

Referring to FIG. 6, a plurality of bottom electrodes BE may be formed in vertical holes 170. The formation of the bottom electrodes BE may include, for example, forming on the upper support layer 134 a bottom electrode layer to fill the vertical holes 170, and planarizing the bottom electrode layer until the upper support layer 134 is exposed. The bottom electrodes BE may be horizontally spaced apart from each other on the interlayer dielectric layer 102 and may be connected to the contact pads 115. When the vertical holes 170 have lateral surfaces caused by the bowing phenomenon as discussed with reference to FIG. 5, neighboring bottom electrodes BE formed in the vertical holes 170 may have a reduced interval in the first and second mold layers 162 and 164. Accordingly, leakage current may occur between the bottom electrode BE.

Figure 7:
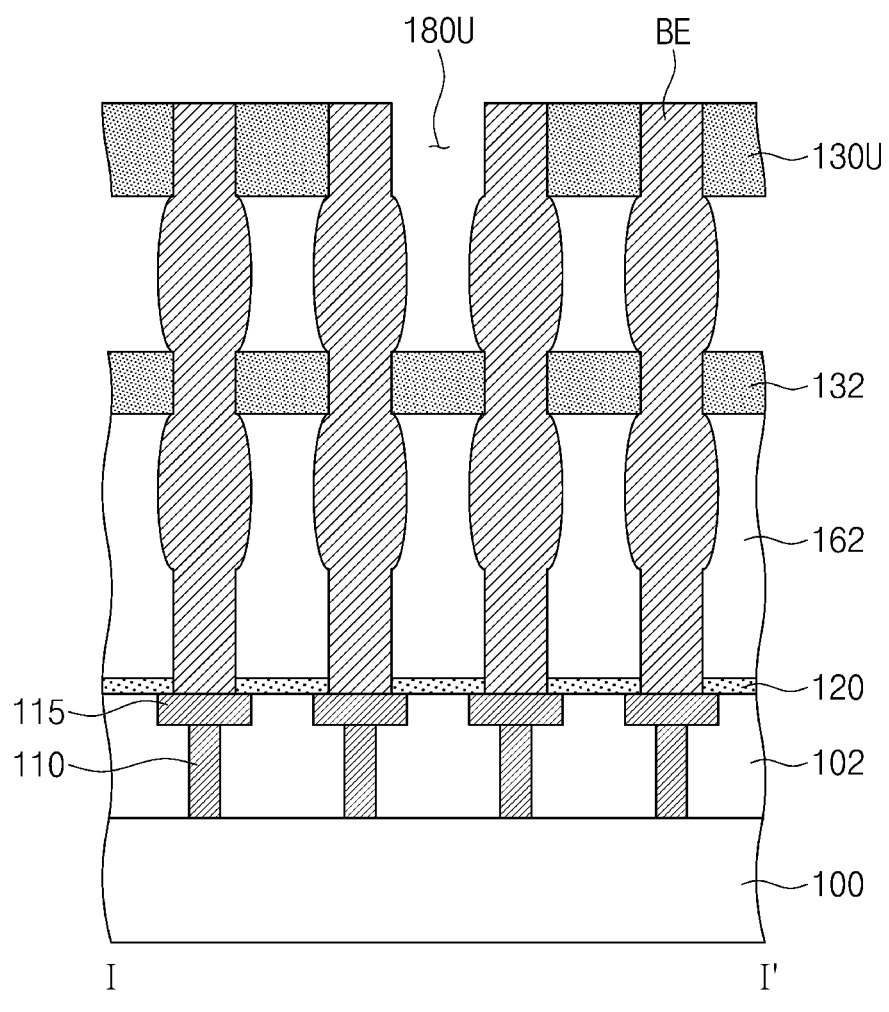

Referring to FIGS. 1 and 7, the upper support layer 134 may be patterned to form an upper support pattern 130U having at least one upper opening 180U. The at least one upper opening 180U may expose upper lateral surfaces of the plurality of first bottom electrodes BE1 and may also expose a top surface of the second mold layer 164. The second mold layer 164 may be removed through the at least one upper opening 180U. The removal of the second mold layer 164 may include selectively etching the second mold layer 164 with respect to the upper support pattern 130U and the lower support layer 132. For example, the second mold layer 164 may be removed by performing an isotropic etching process that uses phosphoric acid. The removal of the second mold layer 164 may partially expose a top surface of the lower support layer 132 and the upper lateral surfaces of the bottom electrodes BE.

Figure 8:
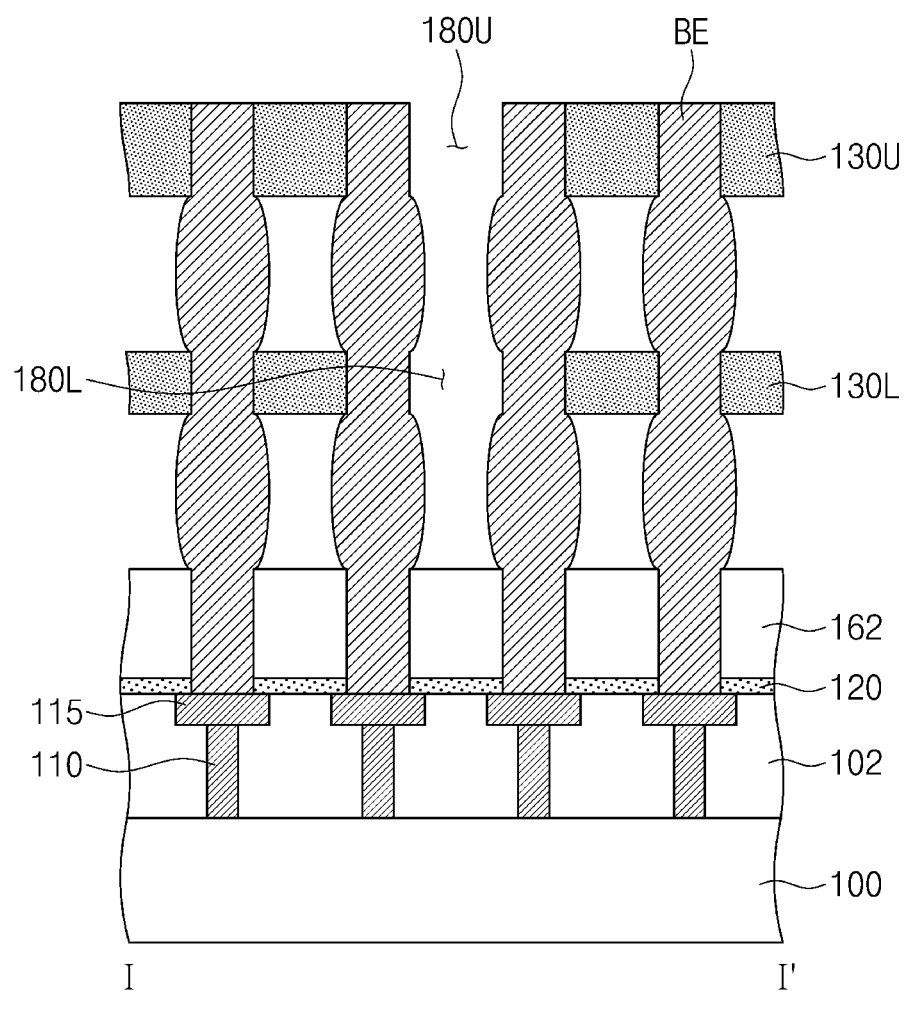

Referring to FIGS. 1 and 8, the lower support layer 132 may be patterned to form a lower support pattern 130L having at least one lower opening 180L. The at least one lower opening 180L may expose lower lateral surfaces of the plurality of first bottom electrodes BE1 and may also expose a top surface of the first mold layer 162. An upper portion of the first mold layer 162 may be removed through the at least one lower opening 180L. The removal of the upper portion of the first mold layer 162 may include selectively etching the first mold layer 162 with respect to the upper support pattern 130U and the lower support pattern 130L. For example, the upper portion of the first mold layer 162 may be removed by performing an isotropic etching process that uses phosphoric acid. The removal of the upper portion of the first mold layer 162 may partially expose the lateral surfaces of the bottom electrodes BE and may allow a lower portion of the first mold layer 162 to remain on the interlayer dielectric layer 102.

Figure 9:
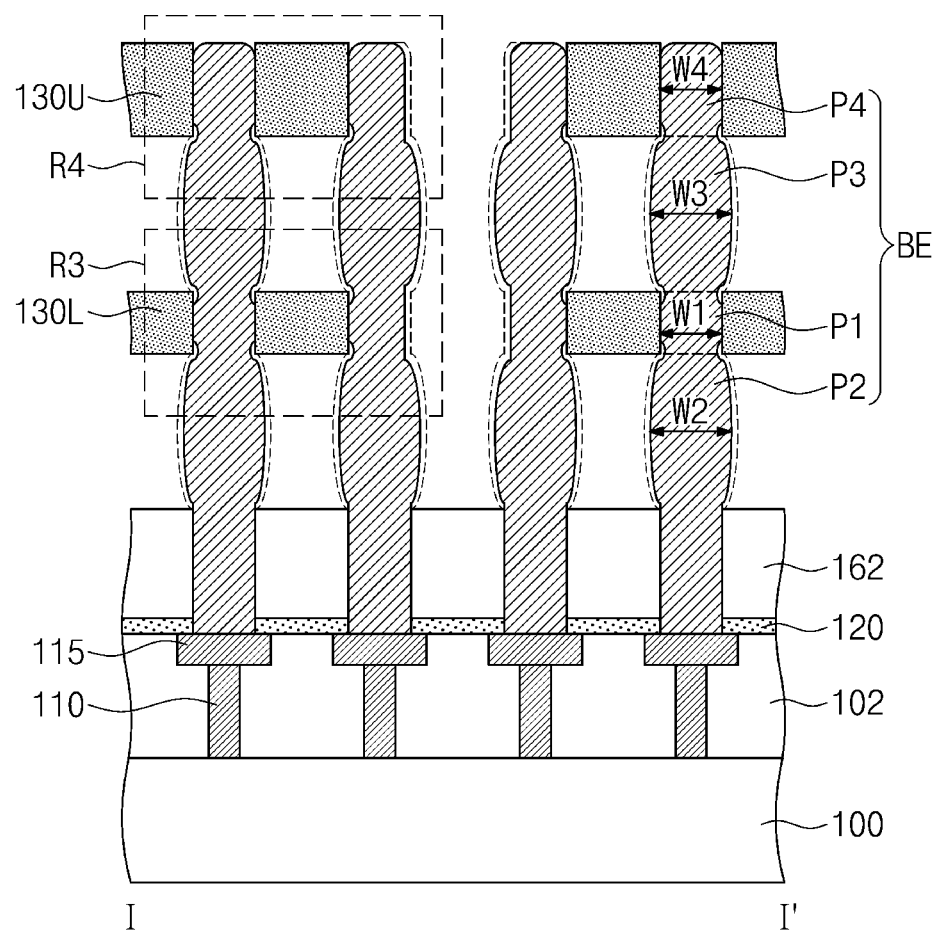
Figure 10A:
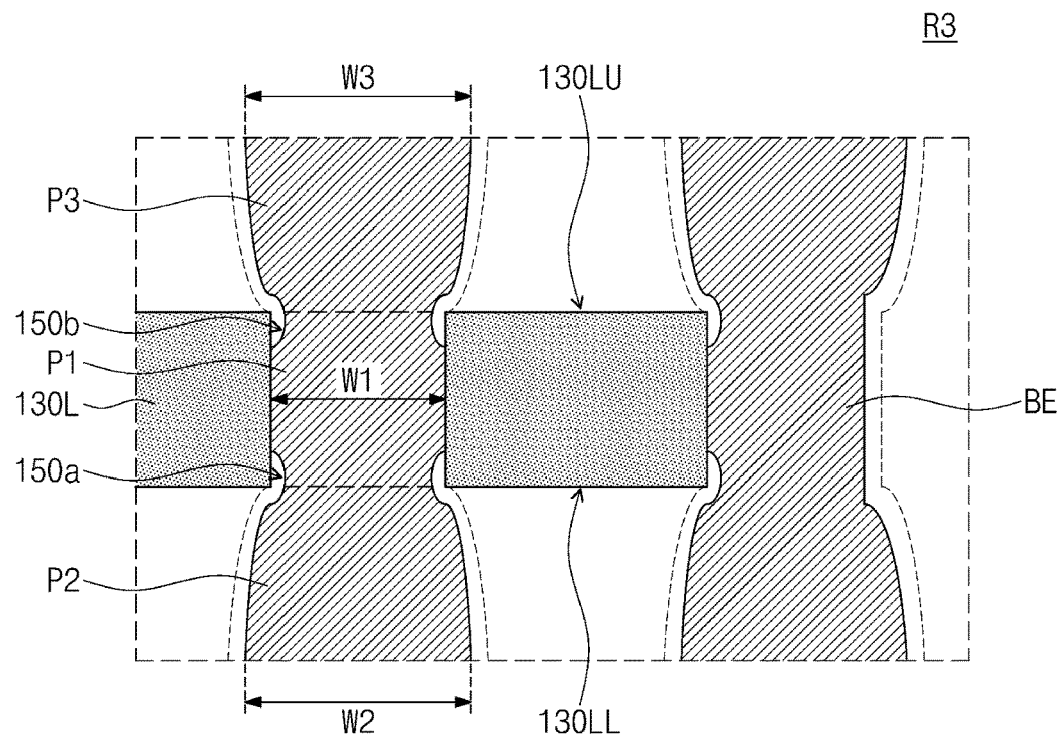
FIGS. 10A and 10B illustrate enlarged views respectively showing sections R3 and R4 of FIG. 9.
Figure 10B:
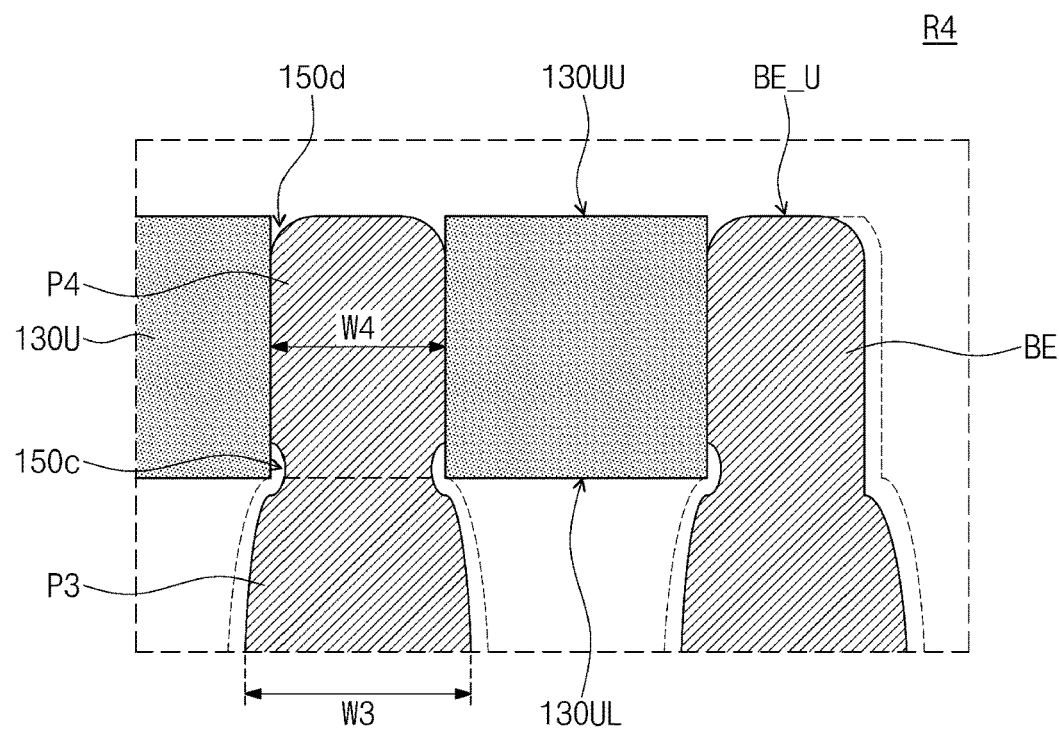

Referring to FIGS. 9, 10A, and 10B, the exposed lateral surfaces of the bottom electrodes BE may be partially etched. The exposed lateral surfaces of the bottom electrodes BE may be etched by a wet etching process whose etch selectivity is high. During the wet etching process, the exposed lateral surfaces of the bottom electrodes BE may be selectively etched with respect to the upper support pattern 130U, the lower support pattern 130L, and the first mold layer 162. Accordingly, each of the bottom electrodes BE may have a reduced width between the upper and lower support patterns 130U and 130L, and below the lower support pattern 130L. According to some example embodiments, as shown in FIGS. 9 and 10A, each of the bottom electrodes BE may include a first part P1 in the lower support pattern 130L and a second part P2 below the lower support pattern 130L. The second part P2 may have a maximum width W2 greater than a maximum width W1 of the first part P1. Each of the bottom electrodes BE may include a third part P3 between the upper and lower support patterns 130U and 130L, and the third part P3 may have a maximum width W3 greater than the maximum width W1 of the first part P1. As shown in FIGS. 9 and 10B, each of the bottom electrodes BE may include a fourth part P4 in the upper support pattern 130U. The maximum width W3 of the third part P3 may be greater than a maximum width W4 of the fourth part P4.

The wet etching process may form in each of the bottom electrodes BE a first recess 150a adjacent to a bottom surface 130LL of the lower support pattern 130L, a second recess 150b adjacent to a top surface 130LU of the lower support pattern 130L, a third recess 150c adjacent to a bottom surface 130UL of the upper support pattern 130U, and a fourth recess 150d adjacent to a top surface 130UU of the upper support pattern 130U. Each of the first, second, and third recesses 150a, 150b, and 150c may be a region that is recessed into the bottom electrode BE from the lateral surface of the bottom electrode BE. The fourth recess 150d may be a region that is recessed into the bottom electrode BE from a top surface BE_U of the bottom electrode BE, and may expose a boundary between the bottom electrode BE and the upper support pattern 130U.

According to the present inventive concepts, the wet etching process may allow each of the bottom electrodes BE to have a reduced width between the upper and lower support patterns 130U and 130L, and below the lower support pattern 130L. Therefore, leakage current may be minimized between the plurality of bottom electrodes BE or leakage current due to electrical short between the plurality of bottom electrodes BE may be avoided.

Figure 11:
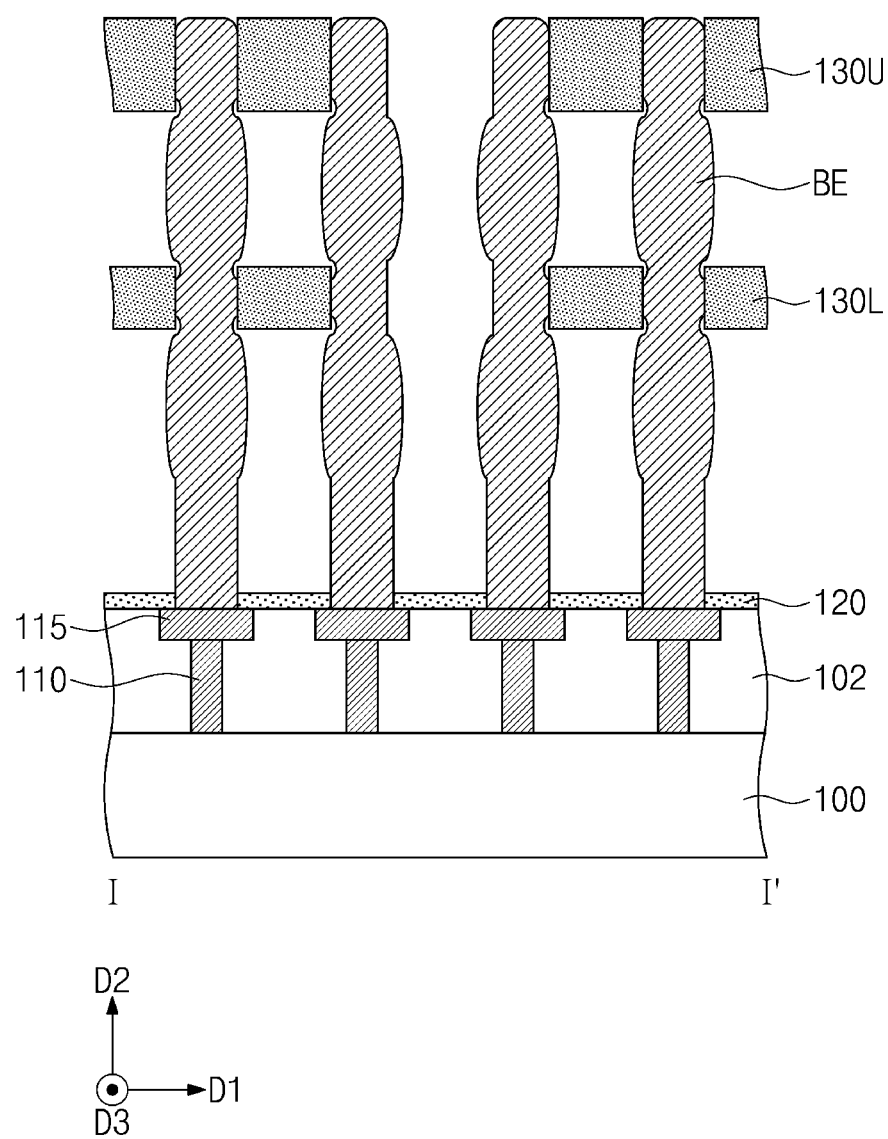

Referring to FIG. 11, after the wet etching process is performed, a lower portion of the first mold layer 162 may be removed. The removal of the lower portion of the first mold layer 162 may include selectively etching the first mold layer 162 with respect to the upper support pattern 130U, the lower support pattern 130L, and the insulating layer 120. For example, the lower portion of the first mold layer 162 may be removed by performing an isotropic etching process that uses phosphoric acid. The removal of the lower portion of the first mold layer 162 may expose a top surface of the insulating layer 120.

Referring back to FIGS. 1 and 2, a dielectric layer 140 and a top electrode TE may be sequentially formed on the interlayer dielectric layer 102. The top electrode TE may fill a space between the plurality of bottom electrodes BE, a space between the interlayer dielectric layer 102 and the lower support pattern 130L, and a space between the lower support pattern 130L and the upper support pattern 130U. The insulating layer 120 may be interposed between the top electrode TE and the interlayer dielectric layer 102. The dielectric layer 140 may be interposed between the top electrode TE and each of the plurality of bottom electrodes BE, between the top electrode TE and the lower support pattern 130L, and the top electrode TE and the upper support pattern 130U. The dielectric layer 140 may extend between the top electrode TE and the insulating layer 120. The dielectric layer 140 and the top electrode TE may be conformally formed by using a layer-deposition technique such as chemical vapor deposition (CVD), physical vapor deposition (PVD), or atomic layer deposition (ALD). In an example embodiment, a process condition of the layer-deposition technique may be controlled such that a step coverage of the dielectric layer 140 is sufficient to conformally cover exposed surfaces of the plurality of bottom electrodes, exposed surfaces of the lower support pattern 130L, exposed surfaces of the upper support pattern 130U, and exposed surfaces of the insulating layer 120. In an example embodiment, a process condition of the layer-deposition technique may be controlled such that a step coverage of the top electrode TE may fill spaces among the plurality of bottom electrodes BE, the top electrode TE, the lower support pattern 130L, the upper support pattern 130U and the insulating layer 120.

Figure 12:
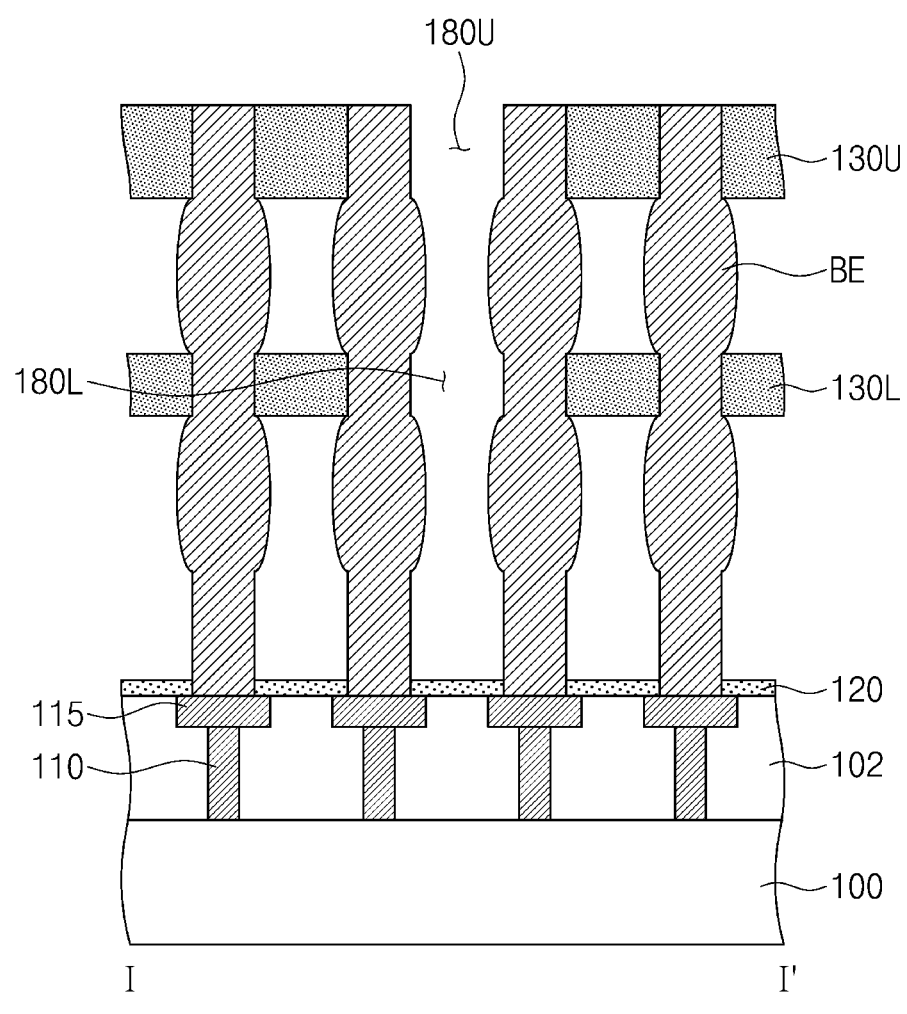
FIGS. 12 and 13 illustrate cross-sectional views taken along line I-I' of FIG. 1, showing a method of fabricating a semiconductor device according to some example embodiments of the present inventive concepts.
Figure 13:
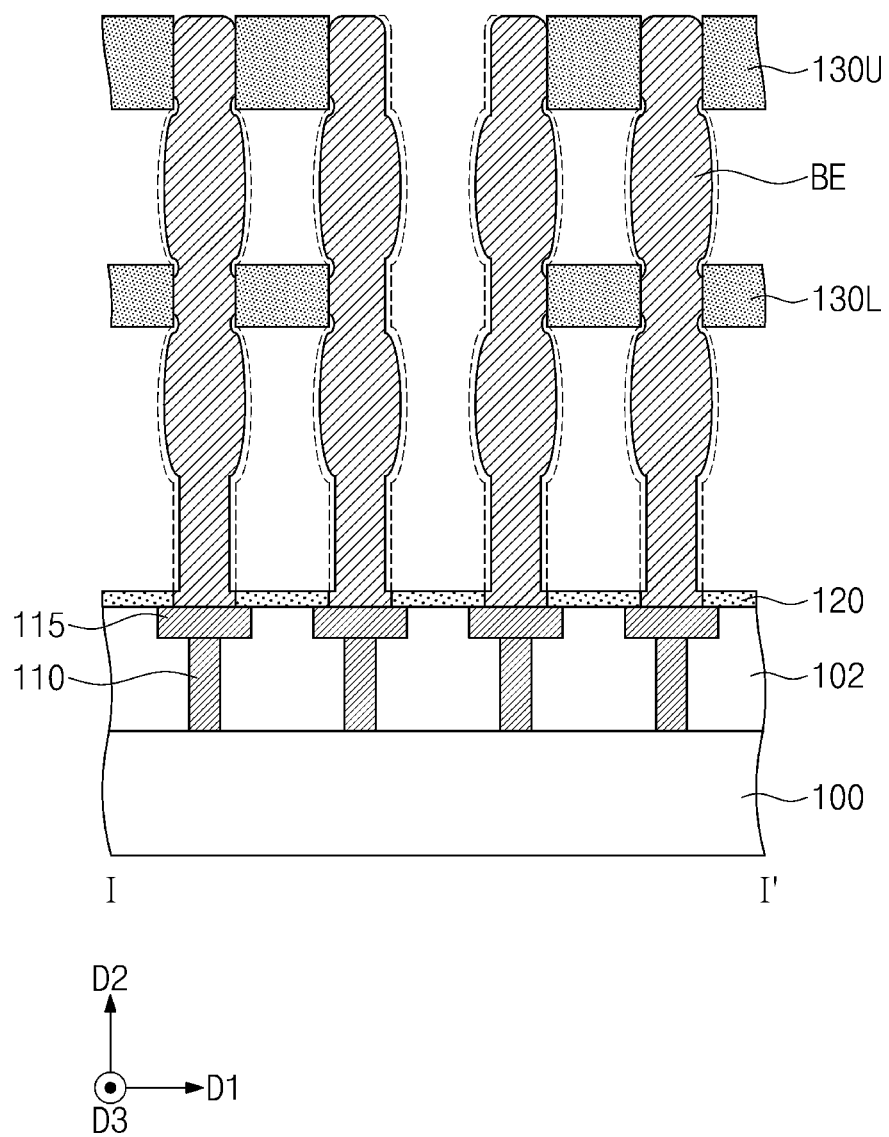

FIGS. 12 and 13 illustrate cross-sectional views taken along line I-I' of FIG. 1, showing a method of fabricating a semiconductor device according to some example embodiments of the present inventive concepts. For brevity of description, the following will focus on differences from the method of fabricating a semiconductor device discussed with reference to FIGS. 4 to 9, 10A, 10B, and 11.

As discussed with reference to FIGS. 7 and 8, the upper support layer 134 may be patterned to form the upper support pattern 130U having the at least one upper opening 180U, and the second mold layer 164 may be removed through the at least one upper opening 180U. Afterwards, the lower support layer 132 may be patterned to form the lower support pattern 130L having the at least one lower opening 180L.

Referring to FIG. 12, the first mold layer 162 may be removed through the at least one lower opening 180L. The removal of the first mold layer 162 may include selectively etching the first mold layer 162 with respect to the upper support pattern 130U and the lower support pattern 130L. For example, the first mold layer 162 may be removed by performing an isotropic etching process that uses phosphoric acid. The removal of the first mold layer 162 may be performed until the insulating layer 120 is exposed. The removal of the first mold layer 162 may expose portions of lateral surfaces of the bottom electrodes BE and a top surface of the insulating layer 120.

Referring to FIG. 13, the exposed lateral surfaces of the bottom electrodes BE may be partially etched. The exposed lateral surfaces of the bottom electrodes BE may be etched by the same method as that discussed with reference to FIGS. 9, 10A, and 10B. A method of fabricating a semiconductor device according to the present embodiment may be substantially the same as the method of fabricating a semiconductor device discussed with reference to FIGS. 4 to 9, 10A,10B, and 11, except the differences mentioned above.

Figure 14:
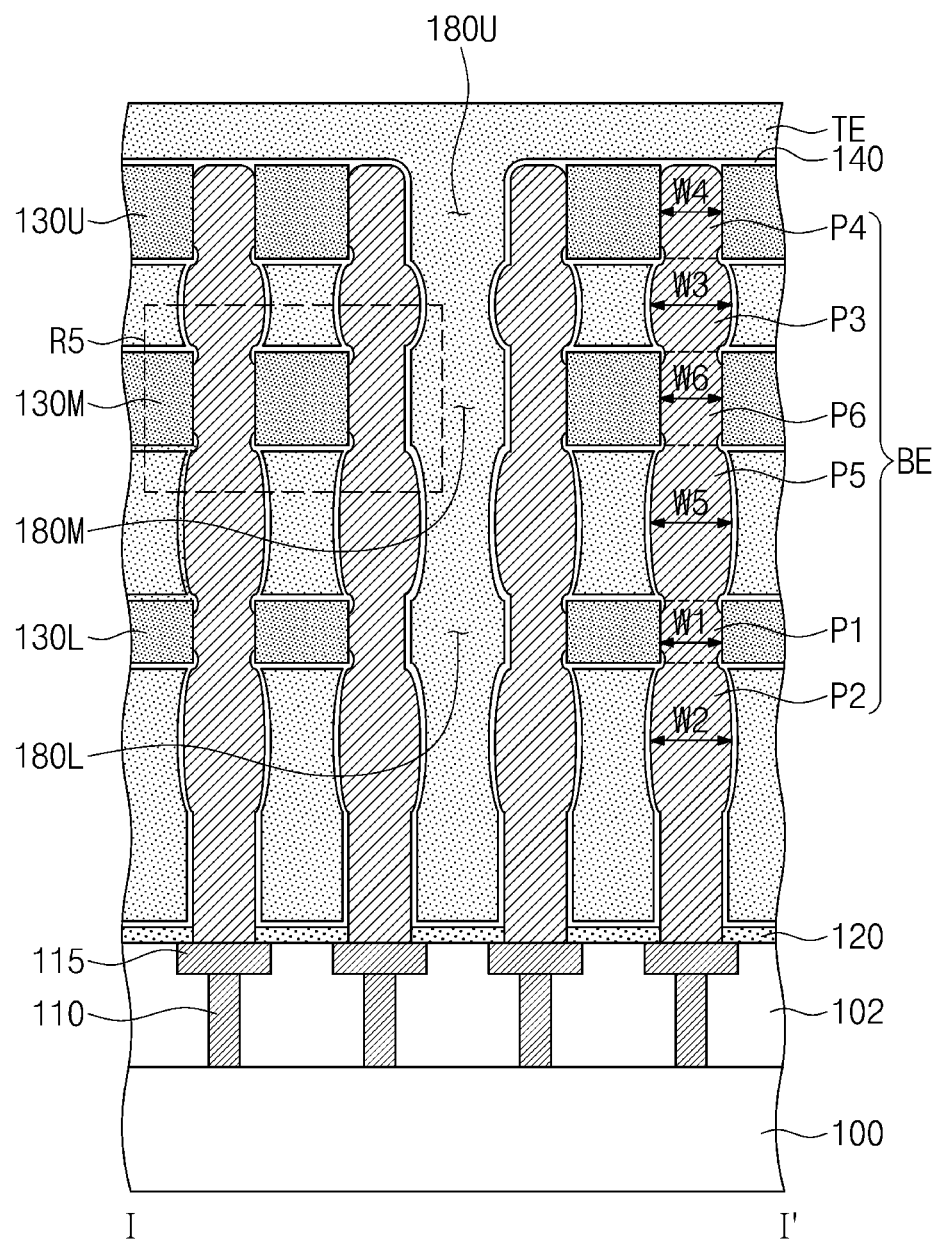
FIG. 14 illustrates a cross-sectional view taken along line I-I' of FIG. 1, showing a semiconductor device according to some example embodiments of the present inventive concepts.
Figure 14:
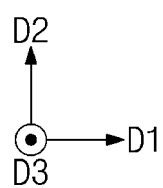
Figure 15:
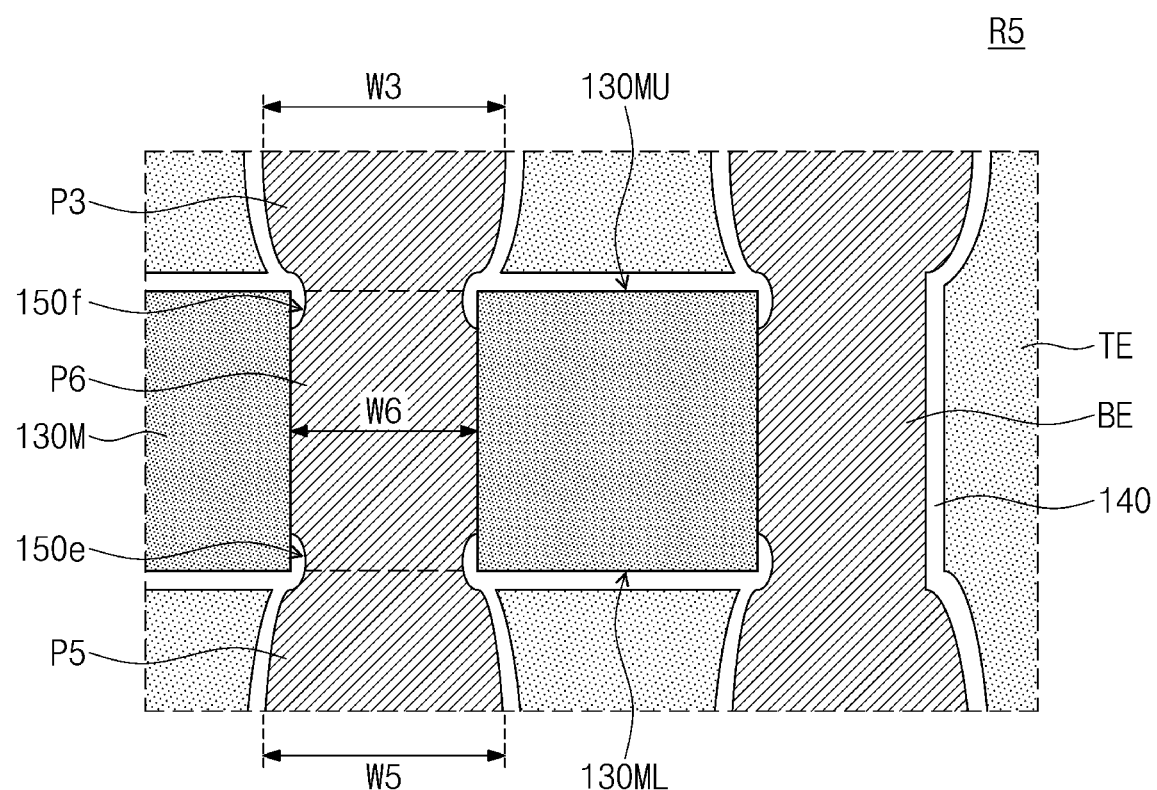
FIG. 15 illustrates an enlarged view showing section R5 of FIG. 14.

FIG. 14 illustrates a cross-sectional view taken along line I-I' of FIG. 1, showing a semiconductor device according to some example embodiments of the present inventive concepts. FIG. 15 illustrates an enlarged view showing section R5 of FIG. 14. For brevity of description, the following will focus on differences from the semiconductor device discussed with reference to FIGS. 1, 2, 3A, and 3B.

Referring to FIGS. 1 and 14, according to some example embodiments, a middle support pattern 130M may be disposed on middle lateral surfaces of the plurality of bottom electrodes BE. The middle support pattern 130M may contact the middle lateral surfaces of the plurality of bottom electrodes BE. The middle support pattern 130M may be disposed between the lower support pattern 130L and the upper support pattern 130U. The middle support pattern 130M may be vertically spaced apart along the second direction D2 from the lower support pattern 130L, and the upper support pattern 130U may be vertically spaced apart along the second direction D2 from the middle support pattern 130M.

The middle support pattern 130M may have at least one middle opening 180M. When viewed in plan, the at least one middle opening 180M may extend along the third direction D3, and may also extend along the middle lateral surfaces of the plurality of first bottom electrodes BEL The at least one middle opening 180M may vertically overlap along the second direction D2 with the at least one lower opening 180L and the at least one upper opening 180U. According to some example embodiments, the middle support pattern 130M may have a plurality of middle openings 180M that are horizontally spaced apart from each other. Each of the plurality of middle openings 180M may extend along the middle lateral surfaces of corresponding ones of the plurality of first bottom electrodes BEL The plurality of middle openings 180M may vertically overlap along the second direction D2 the plurality of lower openings 180L, and may also vertically overlap along the second direction D2 the plurality of upper openings 180U.

Each of the plurality of bottom electrodes BE may penetrate the upper support pattern 130U, the middle support pattern 130M, the lower support pattern 130L, and the insulating layer 120, and may have a connection with a corresponding one of the contact pads 115.

The top electrode TE may be disposed on the interlayer dielectric layer 102, and may cover the plurality of bottom electrodes BE, the lower support pattern 130L, the middle support pattern 130M, and the upper support pattern 130U. The top electrode TE may fill a space between the plurality of bottom electrodes BE, a space between the interlayer dielectric layer 102 and the lower support pattern 130L, a space between the lower support pattern 130L and the middle support pattern 130M, and a space between the middle support pattern 130M and the upper support pattern 130U. The top electrode TE may pass through the at least one upper opening 180U, the at least one middle opening 180M, and the at least one lower opening 180L, and may penetrate the upper support pattern 130U, the middle support pattern 130M, and the lower support pattern 130L. In an example embodiment, the top electrode TE may fill at least one upper opening 180U, the at least one middle opening 180M, and the at least one lower opening 180L.

The dielectric layer 140 may be interposed between the top electrode TE and each of the plurality of bottom electrodes BE, between the top electrode TE and the lower support pattern 130L, between the top electrode TE and the middle support pattern 130M, and between the top electrode TE and the upper support pattern 130U. The middle support pattern 130M may include a dielectric material, for example, at least one selected from oxide, nitride, and oxynitride.

As discussed with reference to FIG. 3A, at least one of the plurality of bottom electrodes BE may include a first recess 150a adjacent to the bottom surface 130LL of the lower support pattern 130L and a second recess 150b adjacent to the top surface 130LU of the lower support pattern 130L. The dielectric layer 140 may cover the bottom and top surfaces 130LL and 130LU of the lower support pattern 130L, and may fill at least a portion of each of the first and second recesses 150a and 150b. The at least one bottom electrode BE may include a first part P1 in the lower support pattern 130L and a second part P2 below the lower support pattern 130L. The second part P2 of the at least one bottom electrode BE may have a maximum width W2 greater than a maximum width W1 of the first part P1 of the at least one bottom electrode BE.

As discussed with reference to FIG. 3B, the at least one bottom electrode BE may further include a third recess 150c adjacent to the bottom surface 130UL of the upper support pattern 130U and a fourth recess 150d adjacent to the top surface 130UU of the upper support pattern 130U. The dielectric layer 140 may cover the bottom and top surfaces 130UL and 130UU of the upper support pattern 130U, and may fill at least a portion of each of the third and fourth recesses 150c and 150d. The at least one bottom electrode BE may include a third part P3 between the upper support pattern 130U and the middle support pattern 130M and a fourth part P4 in the upper support pattern 130U. The third part P3 of the at least one bottom electrode BE may have a maximum width W3 greater than a maximum width W4 of the fourth part P4 of the at least one bottom electrode BE.

Referring to FIGS. 14 and 15, the at least one bottom electrode BE may further include a fifth recess 150e adjacent to a bottom surface 130ML of the middle support pattern 130M. The fifth recess 150e may be a region that is recessed into the at least one bottom electrode BE from the lateral surface of the at least one bottom electrode BE. The dielectric layer 140 may cover the bottom surface 130ML of the middle support pattern 130M and may fill at least a portion of the fifth recess 150e. The at least one bottom electrode BE may further include a sixth recess 150f adjacent to a top surface 130MU of the middle support pattern 130M. The sixth recess 150f may be a region that is recessed into the at least one bottom electrode BE from the lateral surface of the at least one bottom electrode BE. The dielectric layer 140 may cover the top surface 130MU of the middle support pattern 130M and may fill at least a portion of the sixth recess 150f.

The at least one bottom electrode BE may further include a fifth part P5 between the lower support pattern 130L and the middle support pattern 130M and a sixth part P6 in the middle support pattern 130M. The fifth part P5 of the at least one bottom electrode BE may have a maximum width W5 greater than the maximum width W1 of the first part P1 of the at least one bottom electrode BE and greater than a maximum width W6 of the sixth part P6 of the at least one bottom electrode BE. The maximum width W3 of the third part P3 of the at least one bottom electrode BE may be greater than the maximum width W6 of the sixth part P6 of the at least one bottom electrode BE.

Referring back to FIGS. 1 and 14, a capacitor may be constituted by the plurality of bottom electrodes BE, the lower support pattern 130L, the middle support pattern 130M, the upper support pattern 130U, the top electrode TE, and the dielectric layer 140.

FIGS. 16 to 21 illustrate cross-sectional views taken along line I-I' of FIG. 1, showing a method of fabricating a semiconductor device according to some example embodiments of the present inventive concepts. For brevity of description, the following will focus on differences from the method of fabricating a semiconductor device discussed above with reference to FIGS. 4 to 9, 10A, 10B, and 11.

Figure 16:
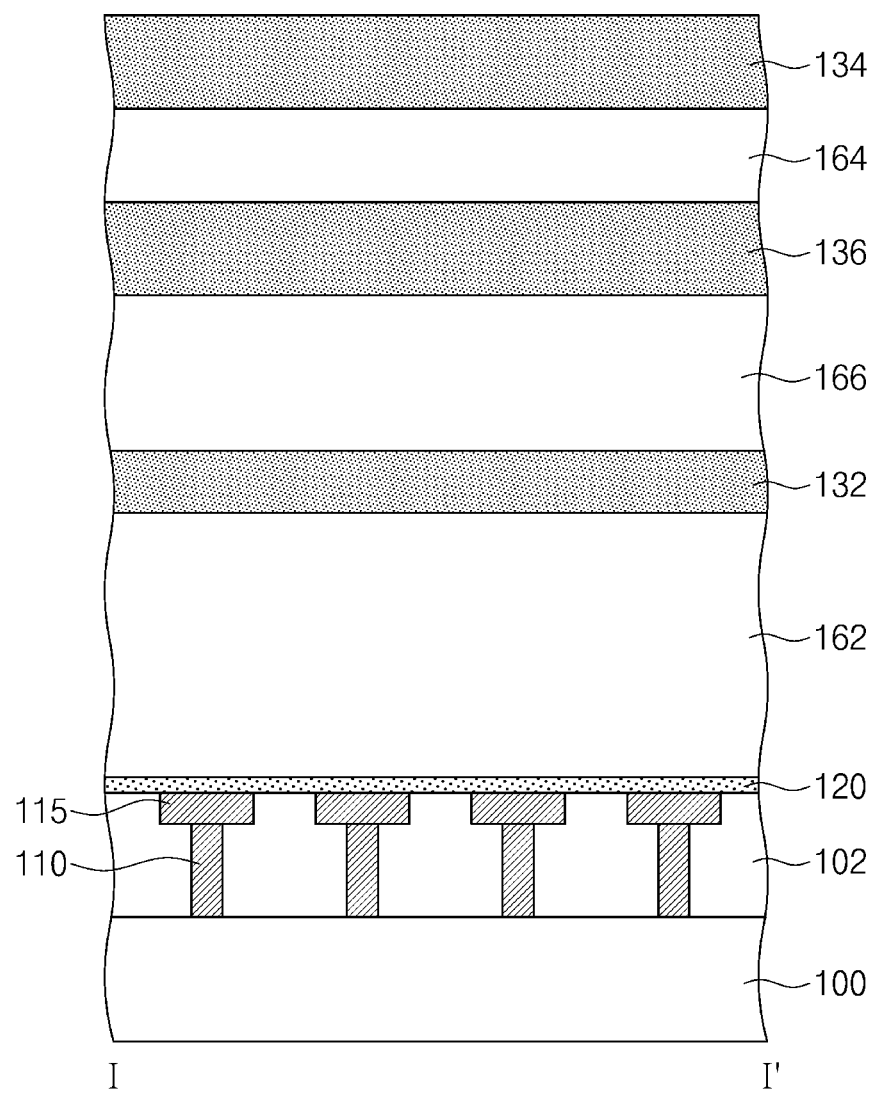
FIGS. 16 to 21 illustrate cross-sectional views taken along line I-I' of FIG. 1, showing a method of fabricating a semiconductor device according to some example embodiments of the present inventive concepts.

Referring to FIG. 16, the first mold layer 162, the lower support layer 132, the second mold layer 164, and the upper support layer 134 may be sequentially formed on the insulating layer 120. According to some example embodiments, a third mold layer 166 may be formed between the lower support layer 132 and the second mold layer 164, and a middle support layer 136 may be formed between the third mold layer 166 and the second mold layer 164. The third mold layer 166 may be formed of, for example, a silicon oxide layer. The middle support layer 136 may be formed of a material having etch selectivity with respect to the first, second, and third mold layers 162, 164 and 166. For example, the middle support layer 136 may include at least one selected from SiN, SiCN, TaO, and TiO$_2$. The middle support layer 136 may have a thickness substantially the same as or greater than that of the lower support layer 132. The upper support layer 134 may have a thickness substantially the same as or greater than that of the middle support layer 136. The third mold layer 166 and the middle support layer 136 may be formed by performing a deposition process, for example, chemical vapor deposition (CVD) or physical vapor deposition (PVD).

Figure 17:
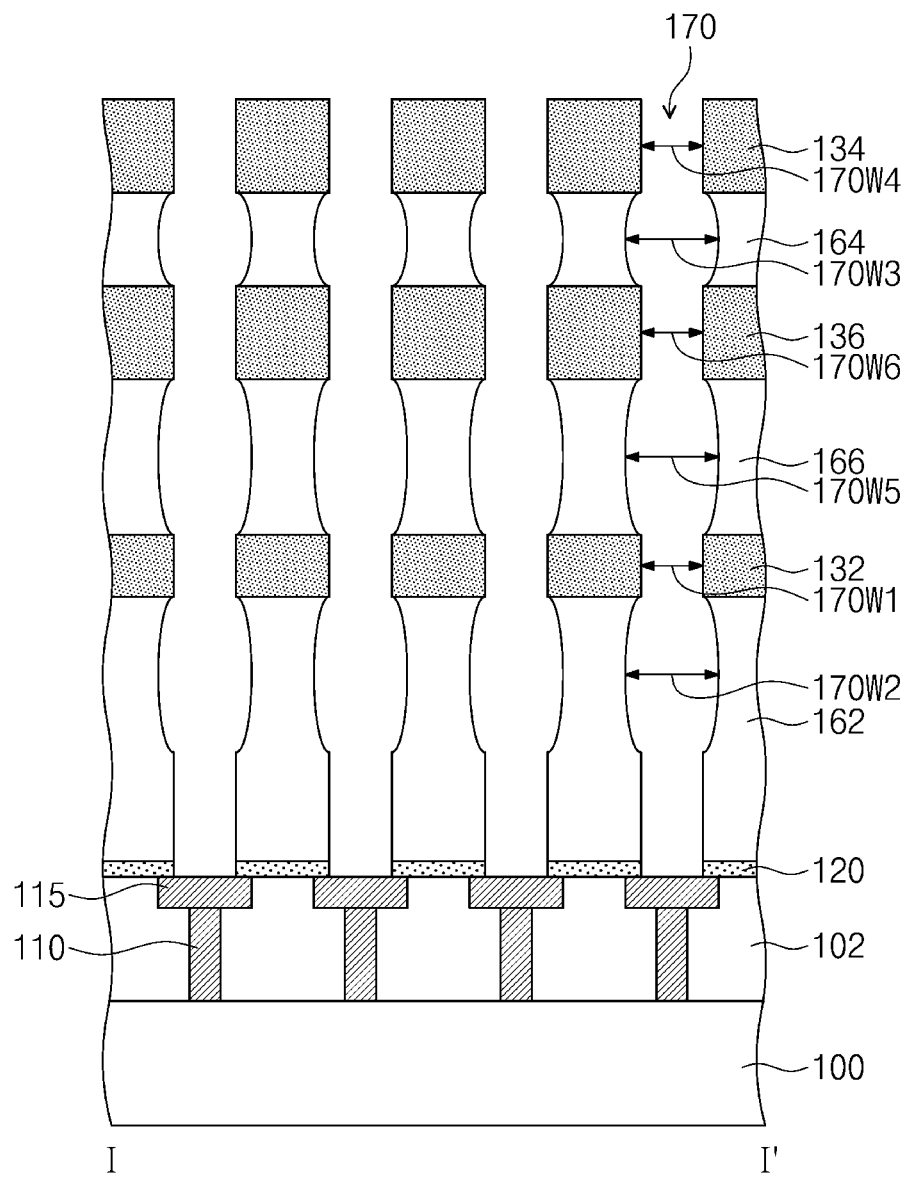

Referring to FIG. 17, vertical holes 170 may be formed in the stacked layers 120, 162, 132, 166, 136, 164, and 134. Each of the vertical holes 170 may penetrate the upper support layer 134, the second mold layer 164, the middle support layer 136, the third mold layer 166, the lower support layer 132, the first mold layer 162, and the insulating layer 120, and may expose a corresponding one of the contact pads 115.

The vertical holes 170 may be formed by substantially the same method (e.g., the dry etching process) as that discussed with reference to FIG. 5. During the dry etching process, the first, second, and third mold layers 162, 164, and 166 may be etched more than the upper support layer 134, the middle support layer 136, and the lower support layer 132, and thus each of the vertical holes 170 may be formed to have a relatively large width in the first, second, and third mold layers 162, 164, and 166. For example, each of the vertical holes 170 formed in the lower support layer 132 may have a first maximum width 170W1, and each of the vertical holes 170 formed in the first mold layer 162 may have a second maximum width 170W2 greater than the first maximum width 170W1. Each of the vertical holes 170 formed in the second mold layer 164 may have a third maximum width 170W3, and each of the vertical holes 170 formed in the upper support layer 134 may have a fourth maximum width 170W4 less than the third maximum width 170W3. Each of the vertical holes 170 formed in the third mold layer 166 may have a fifth maximum width 170W5 greater than the first maximum width 170W1, and each of the vertical holes 170 formed in the middle support layer 136 may have a sixth maximum width 170W6 less than the fifth maximum width 170W5. The third maximum width 170W3 of each of the vertical holes 170 may be greater than the sixth maximum width 170W6 of each of the vertical holes 170.

Figure 18:
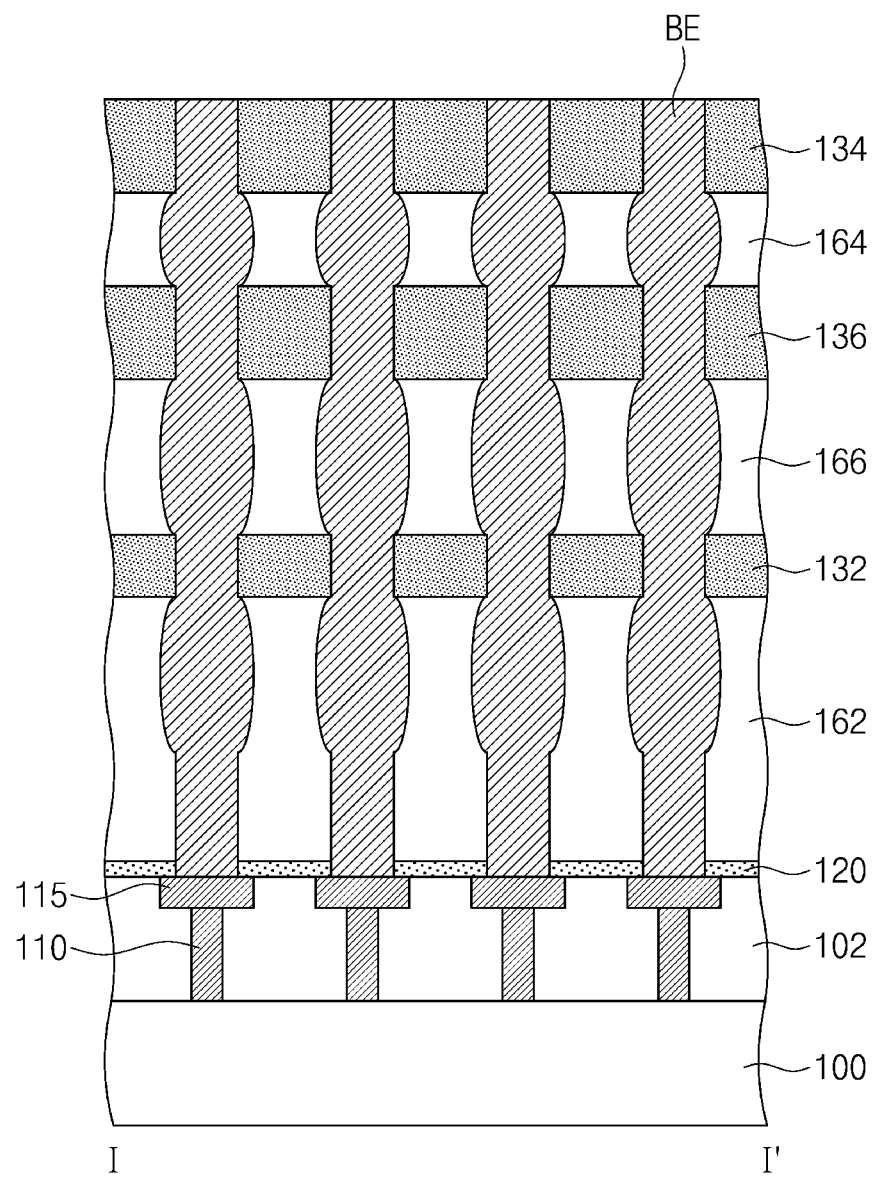

Referring to FIG. 18, bottom electrodes BE may be formed in corresponding vertical holes 170. The bottom electrodes BE may be formed by substantially the same method as that discussed with reference to FIG. 6. When the vertical holes 170 have lateral surfaces caused by the bowing phenomenon as discussed with reference to FIG. 5, neighboring bottom electrodes BE formed in the vertical holes 170 may have a reduced interval in the first, second, and third mold layers 162, 164, and 166. Accordingly, leakage current may occur between the bottom electrode BE.

Figure 19:
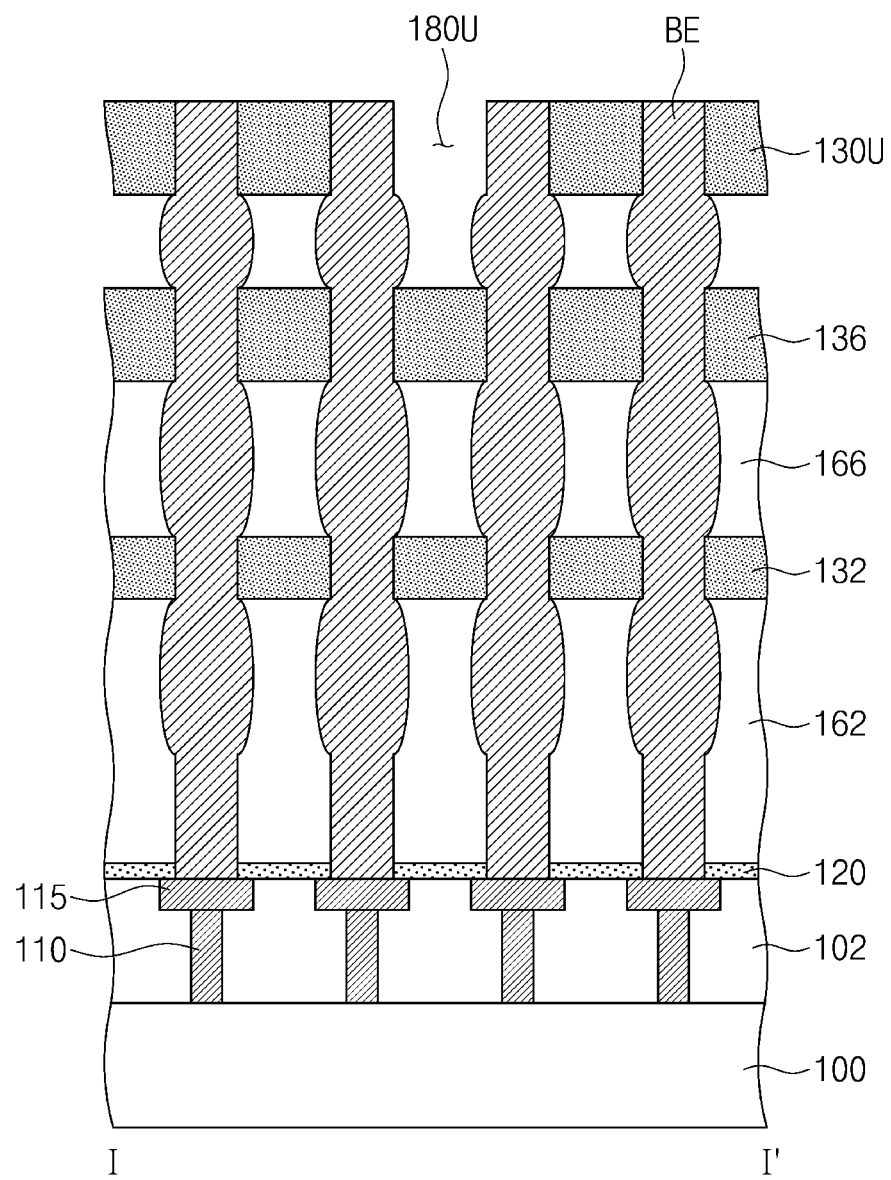

Referring to FIGS. 1 and 19, the upper support layer 134 may be patterned to form an upper support pattern 130U having at least one upper opening 180U. The second mold layer 164 may be removed through the at least one upper opening 180U. The removal of the second mold layer 164 may partially expose a top surface of the middle support layer 136 and lateral surfaces of the bottom electrodes BE.

Figure 20:
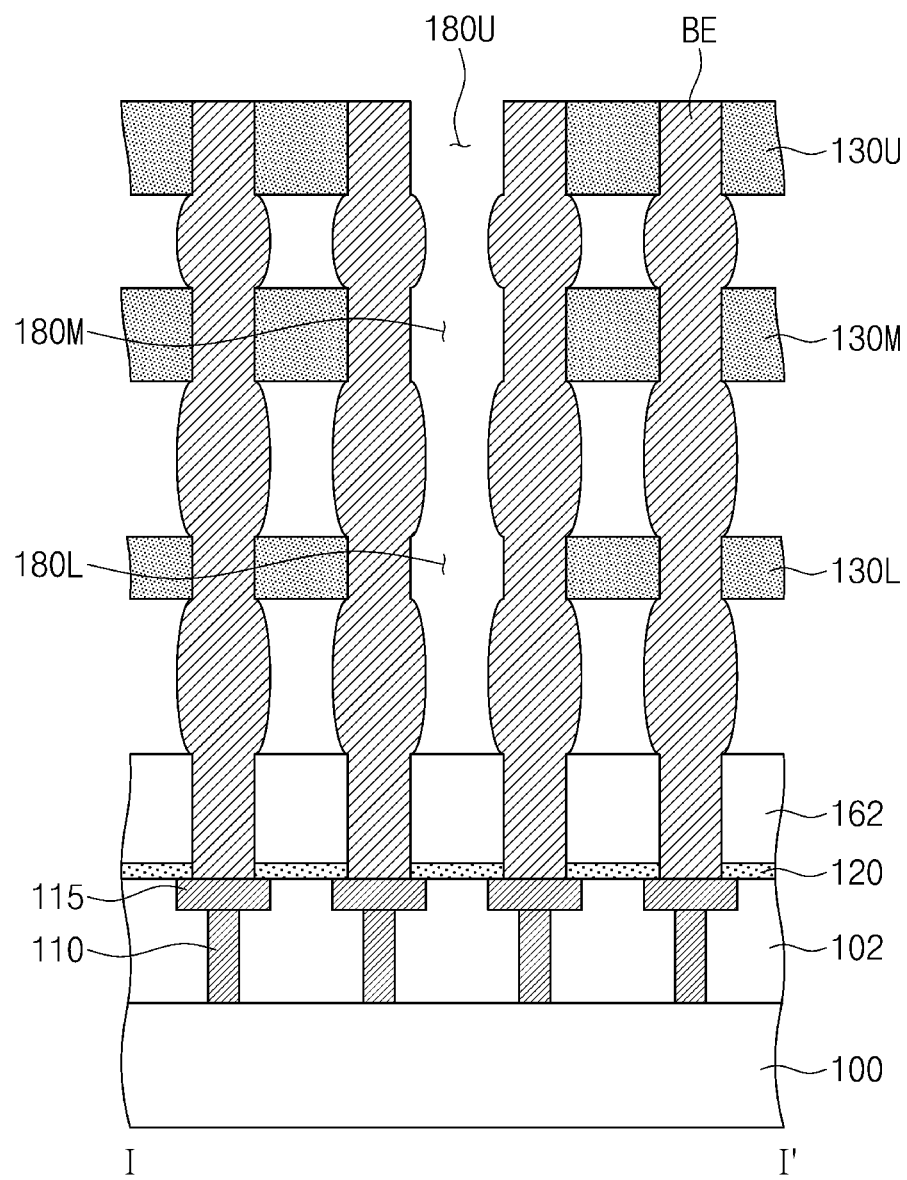
Figure 20:
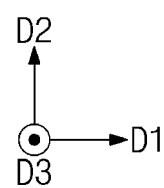

Referring to FIGS. 1 and 20, the middle support layer 136 may be patterned to form a middle support pattern 130M having at least one middle opening 180M. The at least one middle opening 180M may expose middle lateral surfaces of the plurality of first bottom electrodes BE1 and may also expose a top surface of the third mold layer 166. The third mold layer 166 may be removed through the at least one middle opening 180M. The removal of the third mold layer 166 may include selectively etching the third mold layer 166 with respect to the upper support pattern 130U, the middle support pattern 130M, and the lower support layer 132. For example, the third mold layer 166 may be removed by performing an isotropic etching process that uses phosphoric acid. The removal of the third mold layer 166 may partially expose a top surface of the lower support layer 132 and lateral surfaces of the bottom electrodes BE.

The lower support layer 132 may be patterned to form a lower support pattern 130L having at least one lower opening 180L. The at least one lower opening 180L may expose lower lateral surfaces of the plurality of first bottom electrodes BE1 and may also expose a top surface of the first mold layer 162. An upper portion of the first mold layer 162 may be removed through the at least one lower opening 180L. The removal of the upper portion of the first mold layer 162 may partially expose the lateral surfaces of the bottom electrodes BE and may allow a lower portion of the first mold layer 162 to remain on the interlayer dielectric layer 102.

Figure 21:
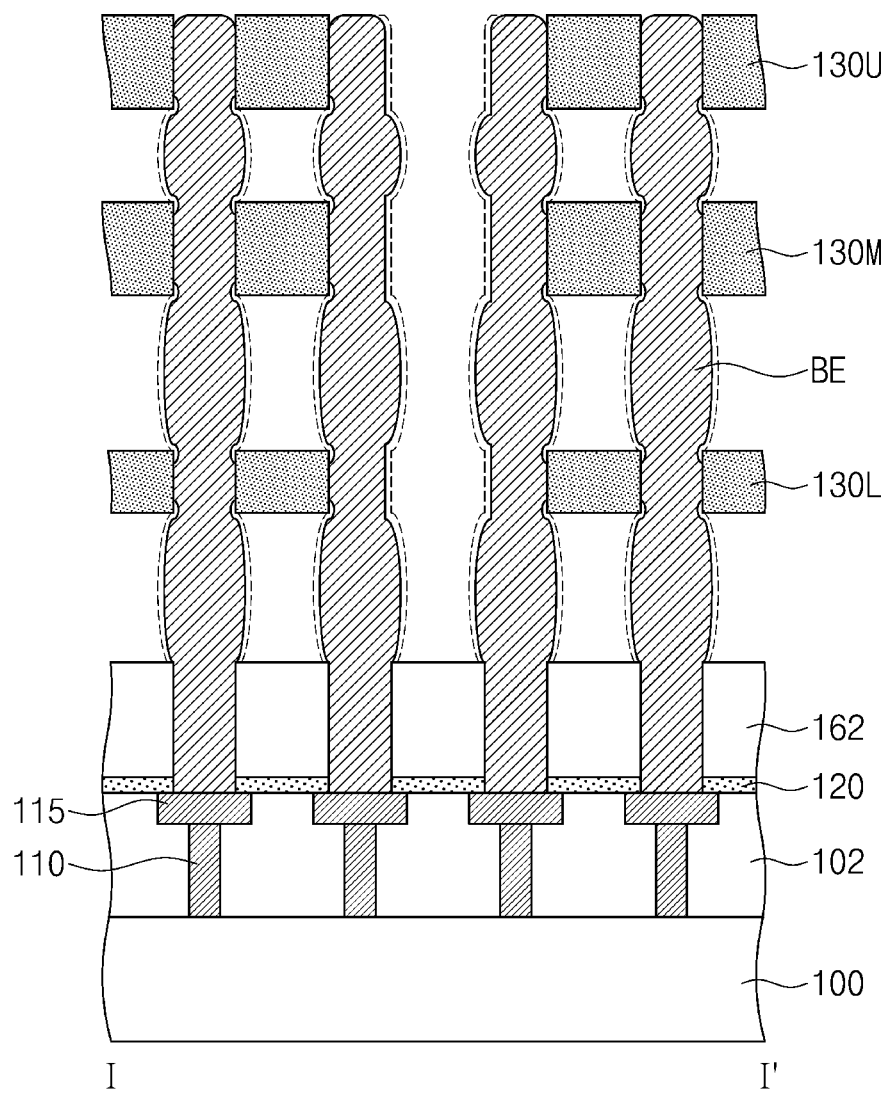

Referring to FIG. 21, the exposed lateral surfaces of the bottom electrodes BE may be partially etched. The exposed lateral surfaces of the bottom electrodes BE may be etched by substantially the same method as that discussed with reference to FIGS. 9, 10A, and 10B. Therefore, each of the bottom electrodes BE may have a reduced width between the upper support pattern 130U and the middle support pattern 130M, between the middle support pattern 130M and the lower support pattern 130L, and below the lower support pattern 130L. According to some example embodiments, while the exposed lateral surfaces of the bottom electrodes BE are partially etched, in each of the bottom electrodes BE, a fifth recess 150e may be formed adjacent to a bottom surface 130ML of the middle support pattern 130M and a sixth recess 150f may be formed adjacent to a top surface 130MU of the middle support pattern 130M, as discussed with reference to FIG. 15. A method of fabricating a semiconductor device according to the present embodiment may be substantially the same as the method of fabricating a semiconductor device discussed with reference to FIGS. 4 to 9, 10A, 10B, and 11, except the differences mentioned above.

According to the present inventive concepts, as the middle support pattern 130M is disposed between the upper support pattern 130U and the lower support pattern 130L, each of the plurality of bottom electrodes BE may have a greater aspect ratio compared to the bottom electrodes BE as described with reference to FIG. 2. Therefore, it may be possible to increase capacitance of a capacitor including the plurality of bottom electrodes BE by increasing the aspect ratio thereof. Moreover, each of the bottom electrodes BE may have a reduced width between the upper support pattern 130U and the middle support pattern 130M, between the middle support pattern 130M and the lower support pattern 130L, and below the lower support pattern 130L. Accordingly, leakage current may be minimized between the plurality of bottom electrodes BE or leakage current due to electrical short between the plurality of bottom electrodes BE may be avoided.

Figure 22:
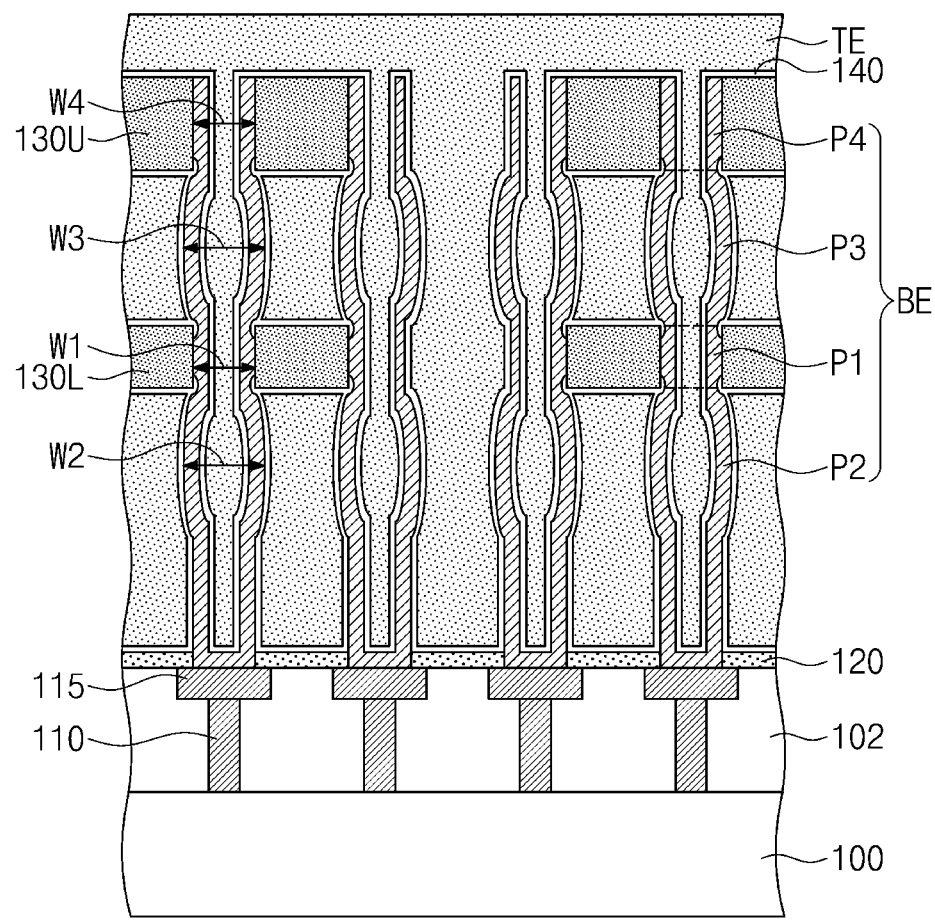
FIG. 22 illustrates a cross-sectional view taken along line I-I' of FIG. 1, showing a semiconductor device according to some example embodiments of the present inventive concepts.

FIG. 22 illustrates a cross-sectional view taken along line I-I' of FIG. 1, showing a semiconductor device according to some example embodiments of the present inventive concepts. For brevity of description, the following will focus on differences from the semiconductor device discussed with reference to FIGS. 1, 2, 3A, and 3B.

Referring to FIG. 22, each of the plurality of bottom electrodes BE may have a hollow cylindrical shape whose one end (e.g., a bottom end) is closed. In this case, each of the plurality of bottom electrodes BE may have an inner surface and an outer surface that are opposite to each other.

The lower support pattern 130L may be disposed on and in contact with lower outer surfaces of the plurality of bottom electrodes BE. The lower support pattern 130L may have at least one lower opening 180L, and the at least one lower opening 180L may extend along the lower outer surfaces of the plurality of first bottom electrodes BEL The upper support pattern 130U may be disposed on and in contact with upper outer surfaces of the plurality of bottom electrodes BE. The upper support pattern 130U may have at least one upper opening 180U, and the at least one upper opening 180U may extend along the upper outer surfaces of the plurality of first bottom electrodes BE1.

The top electrode TE may cover the outer surface of each of the plurality of bottom electrodes BE and may extend onto the inner surface of each of the plurality of bottom electrodes BE. The dielectric layer 140 may be interposed between the top electrode TE and the outer surface of each of the plurality of bottom electrodes BE and between the top electrode TE and the inner surface of each of the plurality of bottom electrodes BE. A semiconductor device according to the present embodiment may be substantially the same as the semiconductor device discussed with reference to FIGS. 1, 2, 3A, and 3B, except the differences mentioned above.

Figure 23:
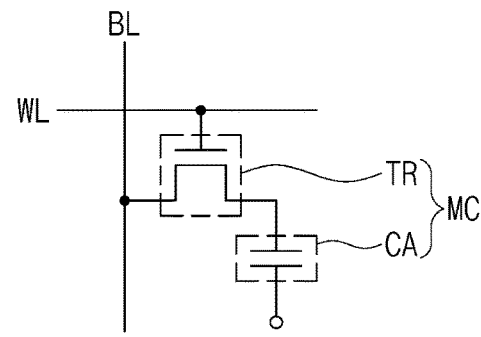
FIG. 23 illustrates a circuit diagram showing a unit memory cell of a semiconductor device according to some example embodiments of the present inventive concepts.

FIG. 23 illustrates a circuit diagram showing a unit memory cell of a semiconductor device according to some example embodiments of the present inventive concepts.

Referring to FIG. 23, a memory cell MC may be disposed between a word line WL and a bit line BL that intersect each other, and may electrically connect the word line WL and the bit line BL to each other. The memory cell MC may include a transistor TR connected to the word line WL and a capacitor CA connected to the transistor TR. The transistor TR may have a drain region connected to the bit line BL and a source region connected to the capacitor CA. The transistor TR may be configured to control a charge flow between the bit line BL and the capacitor CA. The memory cell MC may store data of "0" or "1" depending on whether or not the capacitor CA stores charges.

Figure 24:
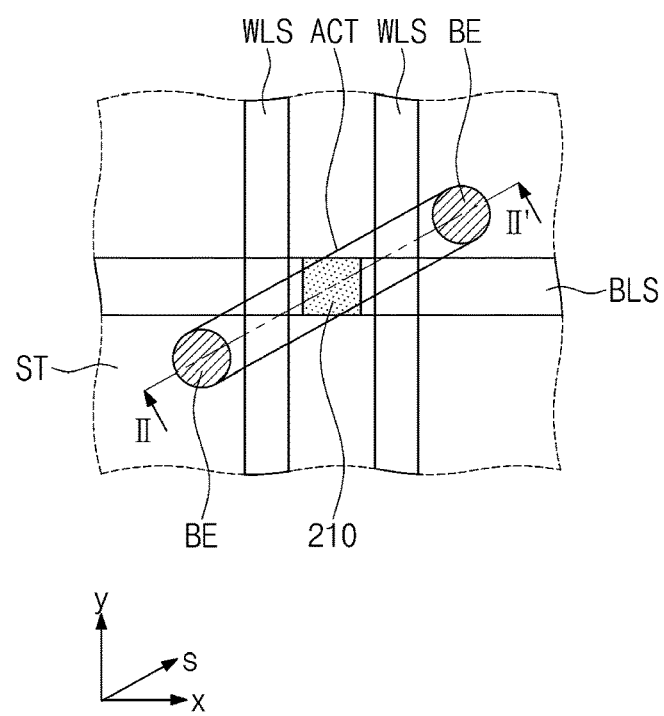
FIG. 24 illustrates a plan view partially showing a semiconductor device according to some example embodiments of the present inventive concepts.
Figure 25:
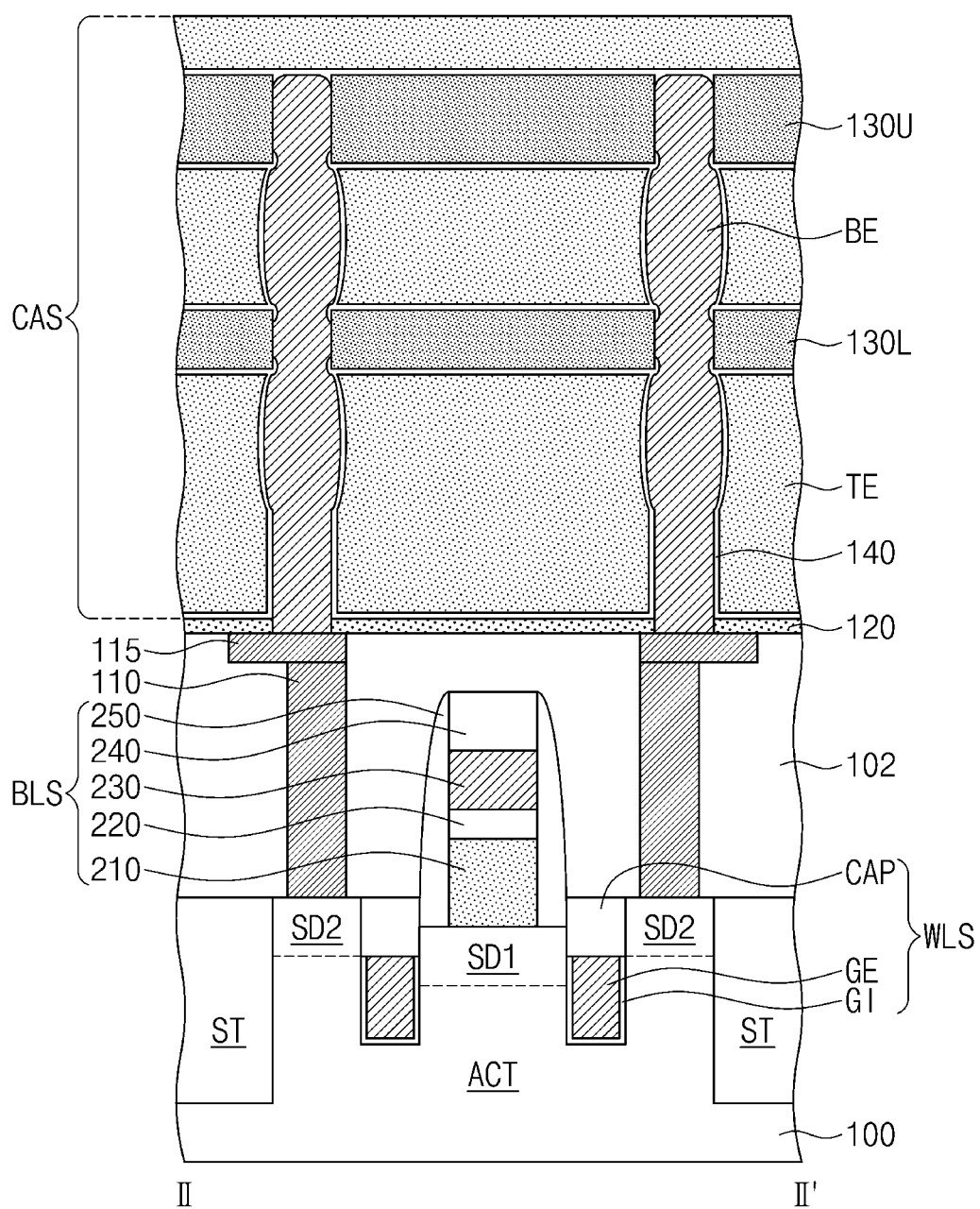
FIG. 25 illustrates a cross-sectional view taken along line II-II' of FIG. 24.

FIG. 24 illustrates a plan view partially showing a semiconductor device according to some example embodiments of the present inventive concepts. FIG. 25 illustrates a cross-sectional view taken along line II-II' of FIG. 24.

Referring to FIGS. 24 and 25, a substrate 100 may have therein a device isolation layer ST that defines an active region ACT. The substrate 100 may be a semiconductor substrate, such as a silicon substrate, a germanium substrate, or a silicon-germanium substrate. The device isolation layer ST may include, for example, one or more of a silicon oxide layer, a silicon nitride layer, and a silicon oxynitride layer. When viewed in plan, the active region ACT may have a bar shape, and may be disposed to allow its major axis to rest in an S direction that intersects an X direction and a Y direction. The X, Y, and S directions may intersect each other while being parallel to a top surface 100U of the substrate 100.

The substrate 100 may have therein word-line structures WLS that run across the active region ACT. The word-line structures WLS may extend in the Y direction and may be arranged along the X direction. Each of the word-line structures WLS may include a gate electrode GE buried in the substrate 100, a gate dielectric pattern GI between the gate electrode GE and the active region ACT and between the gate electrode GE and the device isolation layer ST, and a gate capping pattern CAP on a top surface of the gate electrode GE. The gate capping pattern CAP may have a top surface substantially coplanar with that of the gate capping pattern CAP. According to some example embodiments, the gate capping pattern CAP may have a bottom surface in contact with an uppermost surface of the gate dielectric pattern GI, and may have opposite sidewalls in contact with the active region ACT and/or the device isolation layer ST. According to some other embodiments, the gate dielectric pattern GI may extend between the gate capping pattern CAP and the active region ACT and/or between the gate capping pattern CAP and the device isolation layer ST.

The gate electrode GE may include a conductive material. For example, the conductive material may include one of doped semiconductor materials (doped silicon, doped germanium, etc.), conductive metal nitrides (titanium nitride, tantalum nitride, etc.), metals (tungsten, titanium, tantalum, etc.), and metal-semiconductor compounds (tungsten silicide, cobalt silicide, titanium silicide, etc.). The gate dielectric pattern GI may include, for example, one or more of a silicon oxide layer, a silicon nitride layer, and a silicon oxynitride layer. The gate capping pattern CAP may include, for example, one or more of a silicon oxide layer, a silicon nitride layer, and a silicon oxynitride layer.

The active region ACT may have therein a first impurity region SD1 and second impurity regions SD2, which second impurity regions SD2 are spaced apart from each other across the first impurity region SD1. The first impurity region SD1 may be provided in the active region ACT between a pair of neighboring word-line structures WLS. Each of the second impurity regions SD2 may be provided in the active region ACT on one side of a corresponding one of the pair of word-line structures WLS. For example, the second impurity regions SD2 may be spaced apart from each other across the pair of word-line structures WLS. The first impurity region SD1 may extend deeper into the substrate 100 than the second impurity regions SD2. The first impurity region SD1 may include the same conductive impurity as that of the second impurity regions SD2.

A bit-line structure BLS may be disposed on the substrate 100 and may run across the word-line structures WLS. The bit-line structure BLS may extend in the X direction. The bit-line structure BLS may include a conductive contact 210 electrically connected to the first impurity region SD1, a conductive line 230 on the conductive contact 210 and extending in the X direction, and a barrier pattern 220 between the conductive contact 210 and the conductive line 230. The conductive contact 210 may be in contact with the first impurity region SD1. The conductive contact 210 may have a bottom surface at a height lower than that of the top surface 100U of the substrate 100. The conductive contact 210 may have opposite lateral surfaces aligned with corresponding lateral surfaces of the conductive line 230. The bit-line structure BLS may include a capping pattern 240 on a top surface of the conductive line 230 and spacer patterns 250 on lateral surfaces of the conductive line 230. The capping pattern 240 and the spacer patterns 250 may extend in the X direction along the top and lateral surfaces of the conductive line 230. The spacer patterns 250 may cover lateral surfaces of the capping pattern 240, of the barrier pattern 220, and of the conductive contact 210, and may contact the first impurity region SD1.

The conductive contact 210 may include, for example, one of doped semiconductor materials (doped silicon, doped germanium, etc.), conductive metal nitrides (titanium nitride, tantalum nitride, etc.), metals (tungsten, titanium, tantalum, etc.), and metal-semiconductor compounds (tungsten silicide, cobalt silicide, titanium silicide, etc.). The conductive line 230 and the barrier pattern 220 may each include one of conductive metal nitrides (titanium nitride, tantalum nitride, etc.), metals (tungsten, titanium, tantalum, etc.), and metal-semiconductor compounds (tungsten silicide, cobalt silicide, titanium silicide, etc.). The capping pattern 240 and the spacer patterns 250 may each include, for example, one or more of a silicon nitride layer, a silicon oxide layer, and a silicon oxynitride layer.

An interlayer dielectric layer 102 may be disposed on the substrate 100, and may cover the active region ACT, the device isolation layer ST, the word-line structures WLS, and the bit-line structure BLS. The interlayer dielectric layer 102 may include, for example, at least one selected from silicon oxide, silicon nitride, and silicon oxynitride.

Conductive contacts 110 and contact pads 115 may be disposed in the interlayer dielectric layer 102. The conductive contacts 110 may penetrate a lower portion of the interlayer dielectric layer 102 and may have electrical connection with corresponding second impurity regions SD2. The contact pads 115 may be disposed on corresponding conductive contacts 110. The contact pads 115 may penetrate an upper portion of the interlayer dielectric layer 102 and may have electrical connections with corresponding conductive contacts 110.

An insulating layer 120 may be disposed on the interlayer dielectric layer 102, and a capacitor structure CAS may be disposed on the insulating layer 120. According to some example embodiments, the capacitor structure CAS may include the plurality of bottom electrodes BE, the lower support pattern 130L, the upper support pattern 130U, the top electrode TE, and the dielectric layer 140 that are discussed with reference to FIGS. 1, 2, 3A, and 3B. According to some other embodiments, the capacitor structure CAS may further include the middle support pattern 130M discussed with reference to FIGS. 14 and 15. According to some other embodiments, the plurality of bottom electrodes BE of the capacitor structure CAS may each have a hollow cylindrical shape whose one end is closed, as discussed with reference to FIG. 22.

According to the present inventive concepts, a plurality of support patterns vertically spaced apart from each other may be used for structural stability of a plurality of bottom electrodes each of which has a relatively large aspect ratio. Each of the bottom electrodes may have a reduced width between the plurality of support patterns and below a lowermost one of the plurality of support patterns, and thus leakage current may be minimized between neighboring bottom electrodes or leakage current due to electrical short between the plurality of bottom electrodes BE may be avoided. Accordingly, there may be provided a semiconductor device with improved electrical characteristics and a method of fabricating the same.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A semiconductor device, comprising:
    a memory cell capacitor configured to store data,
    wherein the memory cell capacitor includes:
        a plurality of bottom electrodes on a substrate and extending in a vertical direction with respect to a top surface of the substrate, wherein the plurality of bottom electrodes are spaced apart from each other in a first direction parallel to the top surface of the substrate, wherein the plurality of bottom electrodes includes a first bottom electrode with a first convex lateral surface, a second convex lateral surface, and a flat lateral surface that is disposed between the first convex lateral surface and the second convex lateral surface in a cross-sectional view of the memory cell capacitor;
        an upper support pattern disposed on upper lateral surfaces of the plurality of bottom electrodes; and
        a lower support pattern disposed on lower lateral surfaces of the plurality of bottom electrodes and having a flat side surface,
    wherein the lower support pattern is disposed between the substrate and the upper support pattern,
    wherein the first bottom electrode of the plurality of bottom electrodes further includes a first recessed lateral surface that is disposed between the first convex lateral surface and the flat lateral surface, and wherein the first recessed lateral surface of the first bottom electrode is adjacent to a bottom surface of the lower support pattern; and a dielectric layer filling a space defined by the first recessed lateral surface of the first bottom electrode and the flat side surface of the lower support pattern, wherein the flat side surface of the lower support pattern extends in the vertical direction.

2. The device of claim 1, wherein the first bottom electrode further includes a second recessed lateral surface adjacent to a top surface of the lower support pattern, and the second recessed lateral surface disposed between the second convex lateral surface and the flat lateral surface.

3. The device of claim 2, wherein the first bottom electrode further includes a third recessed lateral surface adjacent to a bottom surface of the upper support pattern.

4. The device of claim 3, further comprising:

a top electrode that covers the plurality of bottom electrodes, the upper support pattern, and the lower support pattern and that is disposed between the substrate and the lower support pattern and between the lower support pattern and the upper support pattern, wherein the dielectric layer between the top electrode and each of the upper support pattern and the lower support pattern, and between the top electrode and each of the plurality of bottom electrodes.

5. The device of claim 4, wherein the first bottom electrode includes a first part surrounded by the lower support pattern and a second part surrounded by the top electrode, wherein the second part is below the first part in the vertical direction, wherein the second part has the first convex lateral surface, wherein the first recessed lateral surface is at a boundary between the first part and the second part, and wherein a maximum width of the second part is greater than a maximum width of the first part.

6. The device of claim 5, wherein the first bottom electrode includes a third part surrounded by the top electrode and a fourth part surrounded by the upper support pattern, wherein the third part is between the fourth part and the first part, wherein the third part has the second convex lateral surface, wherein the second recessed lateral surface is at a boundary between the first part and the third part, wherein the third recessed lateral surface is at a boundary between the third part and the fourth part, and wherein a maximum width of the third part is greater than the maximum width of the first part.

7. The device of claim 4, further comprising:

an interlayer dielectric layer between the substrate and the plurality of bottom electrodes;

a plurality of conductive contacts in the interlayer dielectric layer and connected to the plurality of bottom electrodes; and an insulating layer between the interlayer dielectric layer and the lower support pattern, wherein the plurality of bottom electrodes penetrate the insulating layer and are connected to the plurality of conductive contacts, wherein the top electrode is disposed between the lower support pattern and the insulating layer, and wherein the dielectric layer extends between the top electrode and the insulating layer.

8. The device of claim 4, wherein the upper support pattern includes at least one upper opening, the lower support pattern includes at least one lower opening, and the top electrode is configured to fill the at least one upper opening and the at least one lower opening.

9. The device of claim 8, wherein the at least one upper opening and the at least one lower opening vertically overlap each other.

10. The device of claim 1, wherein the first bottom electrode includes:

a first part in the lower support pattern; and a second part below the lower support pattern in the vertical direction, wherein a maximum width of the second part is greater than a maximum width of the first part.

11. The device of claim 10, wherein the first bottom electrode further includes:

a second recessed lateral surface adjacent to a top surface of the lower support pattern; and a third recessed lateral surface adjacent to a bottom surface of the upper support pattern.

12. The device of claim 11, wherein the first bottom electrode further includes a third part between the upper support pattern and the lower support pattern, and wherein a maximum width of the third part is greater than the maximum width of the first part.

13. The device of claim 12, wherein the first bottom electrode further includes a fourth part surrounded by the upper support pattern, wherein the third part is between the fourth part and the first part, and wherein the maximum width of the third part is greater than a maximum width of the fourth part.

14. A semiconductor device, comprising:

a plurality of bottom electrodes on a substrate and extending in a vertical direction with respect to a top surface of the substrate, wherein the plurality of bottom electrodes are spaced apart from each other in a first direction parallel to the top surface of the substrate;

a lower support pattern disposed on lower lateral surfaces of the plurality of bottom electrodes and having a flat side surface;

an upper support pattern disposed on the lower support pattern and on upper lateral surfaces of the plurality of bottom electrodes;

a top electrode that fills a space between the plurality of bottom electrodes, a space between the substrate and the lower support pattern, and a space between the lower support pattern and the upper support pattern; and a dielectric layer between the top electrode and each of the upper support pattern and the lower support pattern, and between the top electrode and each of the plurality of bottom electrodes, wherein a first bottom electrode of the plurality of bottom electrodes includes a first convex lateral surface, a second convex lateral surface, and a flat lateral surface that is disposed between the first convex lateral surface and the second convex lateral surface in a cross-sectional view, wherein the first bottom electrode further includes:
- a first recessed lateral surface that is disposed between the first convex lateral surface and the flat lateral surface and that is disposed adjacent to a bottom surface of the lower support pattern, and
- a second recessed lateral surface that is disposed between the flat lateral surface and the second convex lateral surface and that is disposed adjacent to a top surface of the lower support pattern, wherein the dielectric layer covers the bottom surface of the lower support pattern and fills a space defined by the first recessed lateral surface of the first bottom electrode and the flat side surface of the lower support pattern, and wherein the flat side surface of the lower support pattern extends in the vertical direction.

15. The device of claim 14, wherein the dielectric layer covers the top surface of the lower support pattern and fills a space defined by the second recessed lateral surface of the first bottom electrode and the flat side surface of the lower support pattern.

16. The device of claim 14, wherein the first bottom electrode further includes a third recessed lateral surface adjacent to a bottom surface of the upper support pattern.

17. The device of claim 16, wherein the dielectric layer covers the bottom surface of the upper support pattern and fills a space defined by the third recessed lateral surface of the first bottom electrode and a flat side surface of the upper support pattern.

18. The device of claim 14, wherein the first bottom electrode includes:

a first part surrounded by the lower support pattern; and a second part surrounded by the top electrode, wherein the second part is below the first part in the vertical direction, and wherein a maximum width of the second part is greater than a maximum width of the first part.

* * * * *